(12) United States Patent
Wu et al.

(10) Patent No.: US 12,733,199 B2
(45) Date of Patent: Sep. 8, 2026

(54) GATE RESISTANCE REDUCTION THROUGH LOW-RESISTIVITY CONDUCTIVE LAYER

(71) Applicant: Taiwan Semiconductor Manufacturing Co., Ltd., Hsinchu (TW)

(72) Inventors: Chung-Chiang Wu, Taichung City (TW); Po-Cheng Chen, Jiaoxi Township (TW); Kuo-Chan Huang, Hsinchu (TW); Hung-Chin Chung, Pingzhen City (TW); Hsien-Ming Lee, Changhua (TW); Chien-Hao Chen, Chuangwei Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/421,681

(22) Filed: Jan. 24, 2024

(65) Prior Publication Data

US 2024/0162349 A1 May 16, 2024

Related U.S. Application Data

(60) Continuation of application No. 17/658,708, filed on Apr. 11, 2022, now Pat. No. 11,916,146, which is a (Continued)

(51) Int. Cl.
*H10D 30/00* (2025.01)
*H10D 30/62* (2025.01)
(Continued)

(52) U.S. Cl.
CPC ......... *H10D 30/6211* (2025.01); *H10D 64/01* (2025.01); *H10D 64/017* (2025.01);
(Continued)

(58) Field of Classification Search
CPC .. H10D 30/6211; H10D 64/01; H10D 64/017; H10D 64/517; H10D 64/667;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

CN 105990445 A 10/2016
CN 108807160 A 11/2018
(Continued)

*Primary Examiner* — Samuel Park
(74) *Attorney, Agent, or Firm* — Slater Matsil, LLP

(57) ABSTRACT

A device includes a semiconductor fin, and a gate stack on sidewalls and a top surface of the semiconductor fin. The gate stack includes a high-k dielectric layer, a work-function layer overlapping a bottom portion of the high-k dielectric layer, and a blocking layer overlapping a second bottom portion of the work-function layer. A low-resistance metal layer overlaps and contacts the work-function layer and the blocking layer. The low-resistance metal layer has a resistivity value lower than second resistivity values of both of the work-function layer and the blocking layer. A gate spacer contacts a sidewall of the gate stack.

20 Claims, 19 Drawing Sheets

Related U.S. Application Data division of application No. 16/571,879, filed on Sep. 16, 2019, now Pat. No. 11,302,818.

(51) Int. Cl.

| | |
|---|---|
| ***H10D 64/01*** | (2025.01) |
| ***H10D 64/27*** | (2025.01) |
| ***H10D 64/66*** | (2025.01) |
| ***H10D 84/01*** | (2025.01) |
| ***H10D 84/03*** | (2025.01) |
| ***H10D 84/83*** | (2025.01) |

(52) U.S. Cl.

CPC ......... *H10D 64/517* (2025.01); *H10D 64/667* (2025.01); *H10D 84/0158* (2025.01); *H10D 84/038* (2025.01); *H10D 84/834* (2025.01)

(58) Field of Classification Search

CPC ............. H10D 84/0158; H10D 84/038; H10D 84/834; H10D 30/62; H10D 30/024; H10D 64/513; H10D 30/0243; H10D 30/6215

See application file for complete search history.

(56) References Cited

U.S. PATENT DOCUMENTS

| | | | | |
|---|---|---|---|---|
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 10,008,494 | B2 | 6/2018 | Lai et al. | |
| 10,510,596 | B2 | 12/2019 | Tsai et al. | |
| 10,879,370 | B2 | 12/2020 | Lim et al. | |
| 11,810,819 | B2 | 11/2023 | Tsai et al. | |
| 2012/0175711 | A1* | 7/2012 | Ramachandran | H10D 64/01 438/586 |
| 2014/0203333 | A1 | 7/2014 | Huang et al. | |
| 2015/0118836 | A1 | 4/2015 | Lin et al. | |
| 2015/0145057 | A1 | 5/2015 | Fan et al. | |
| 2015/0270177 | A1* | 9/2015 | Tseng | H01L 21/28088 438/287 |
| 2016/0056262 | A1* | 2/2016 | Ho | H10D 64/017 257/288 |
| 2016/0284699 | A1 | 9/2016 | Jeong et al. | |
| 2016/0351673 | A1 | 12/2016 | Lai et al. | |
| 2017/0125537 | A1 | 5/2017 | Jangjian et al. | |
| 2018/0151670 | A1 | 5/2018 | Wu | |
| 2018/0174904 | A1 | 6/2018 | Hsieh et al. | |
| 2018/0174922 | A1 | 6/2018 | Chiu et al. | |
| 2018/0175165 | A1* | 6/2018 | Lim | H10D 62/021 |
| 2018/0261677 | A1 | 9/2018 | Lee et al. | |
| 2018/0331219 | A1 | 11/2018 | Liou et al. | |
| 2019/0157410 | A1 | 5/2019 | Yim et al. | |

FOREIGN PATENT DOCUMENTS

| | | | |
|---|---|---|---|
| DE | 102017113479 | A1 | 10/2018 |
| KR | 20160140313 | A | 12/2016 |
| KR | 20170049350 | A | 5/2017 |
| KR | 20180069673 | A | 6/2018 |
| KR | 20180102273 | A | 9/2018 |
| KR | 20190059665 | A | 5/2019 |

* cited by examiner

GATE RESISTANCE REDUCTION THROUGH LOW-RESISTIVITY CONDUCTIVE LAYER

PRIORITY CLAIM AND CROSS-REFERENCE

This application is a continuation of U.S. patent application Ser. No. 17/658,708, entitled "Gate Resistance Reduction Through Low-Resistivity Conductive Layer," filed on Apr. 11, 2022, which is a divisional of U.S. patent application Ser. No. 16/571,879, entitled "Gate Resistance Reduction Through Low-Resistivity Conductive Layer," filed on Sep. 16, 2019, now U.S. Pat. No. 11,302,818, issued Apr. 12, 2022, which applications are incorporated herein by reference.

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

A metal gate may include a plurality of layers to meet the requirements of the NMOS devices and PMOS devices. The formation of metal gates typically involves depositing a plurality of metal layers, forming a filling metal region with tungsten, and then performing a Chemical Mechanical Polish (CMP) process to remove excess portions of the metal layers. The remaining portions of the metal layers are metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6, 7A, 7B, 8A, 8B, and 9-15 illustrate the cross-sectional views and perspective views of intermediate stages in the formation of Fin Field-Effect Transistors (FinFETs) in accordance with some embodiments.

DETAILED DESCRIPTION

Figure 1:
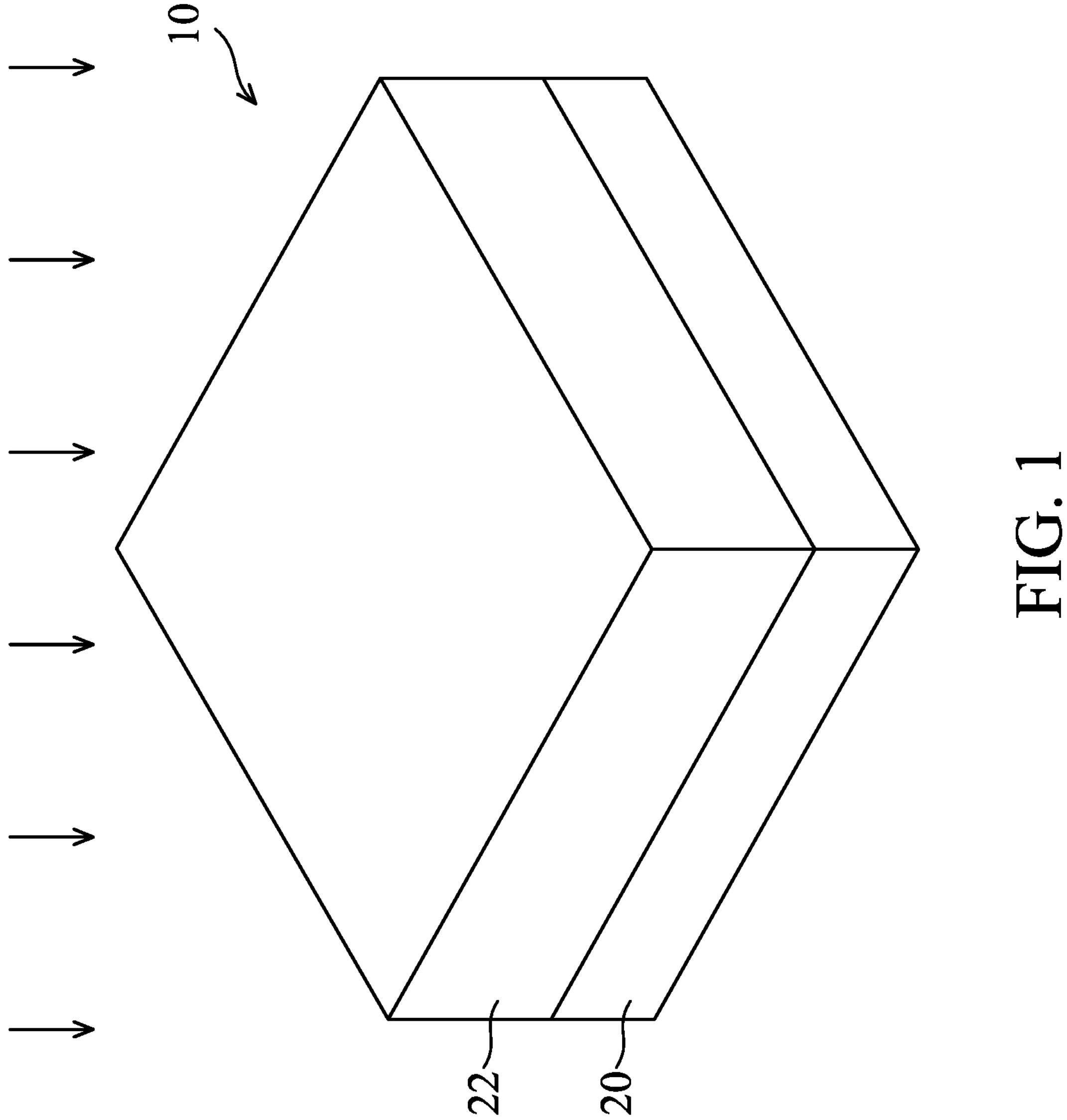

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. Although method embodiments may be discussed as being performed in a particular order, other method embodiments may be performed in any logical order. In accordance with embodiments, the formation of Fin Field-Effect Transistors (FinFETs) is used as an example to explain the concept of the present disclosure. Other types of transistors such as planar transistors may also adopt the concept of the present disclosure. In accordance with some embodiments of the present disclosure, a metal (replacement) gate is formed for a FinFET. The metal gate is then etched and recessed, so that a recess is generated. A low-resistivity conductive layer is formed over and contacting the recessed metal gate. The low-resistivity conductive layer has a resistivity lower than the resistivity of the layers in the metal gate, so that the overall gate resistance of the metal gate is reduced.

Figure 17:
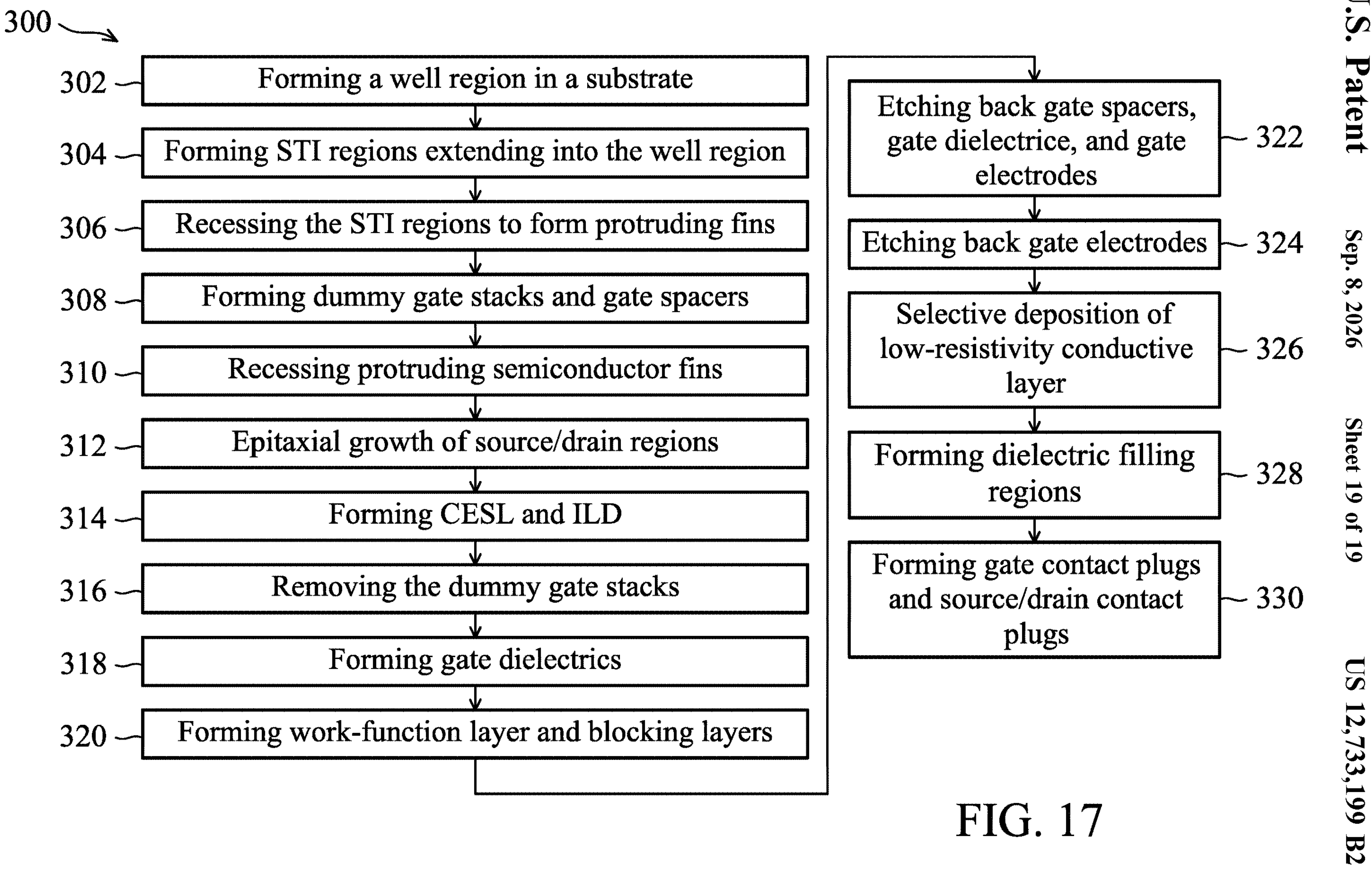
FIG. 17 illustrates a flow chart of a process for forming a FinFET in accordance with some embodiments.

FIGS. 1-6, 7A, 7B, 8A, 8B, and 9-15 illustrate the cross-sectional views and perspective views of intermediate stages in the formation of FinFETs in accordance with some embodiments of the present disclosure. The processes shown in these figures are also reflected schematically in the process flow 300 shown in FIG. 17.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 302 in the process flow 300 shown in FIG. 17. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ $cm^{-3}$, such as in the range between about $10^{17}$ $cm^{-3}$ and about $10^{18}$ $cm^{-3}$.

Figure 2:
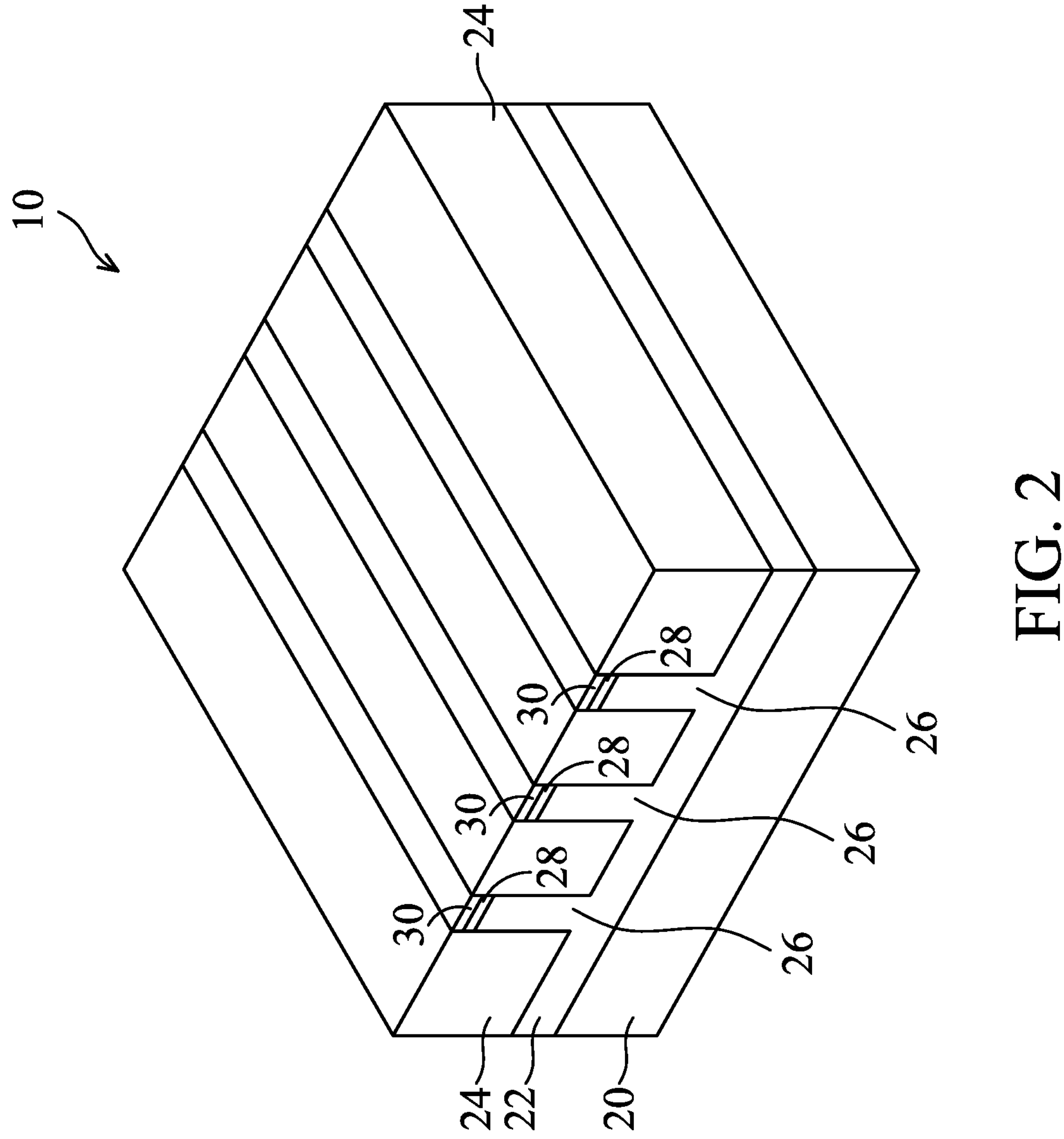

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 304 in the process flow 300 shown in FIG. 17. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner dielectric, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material. Hard masks 30 are then removed.

Figure 3:
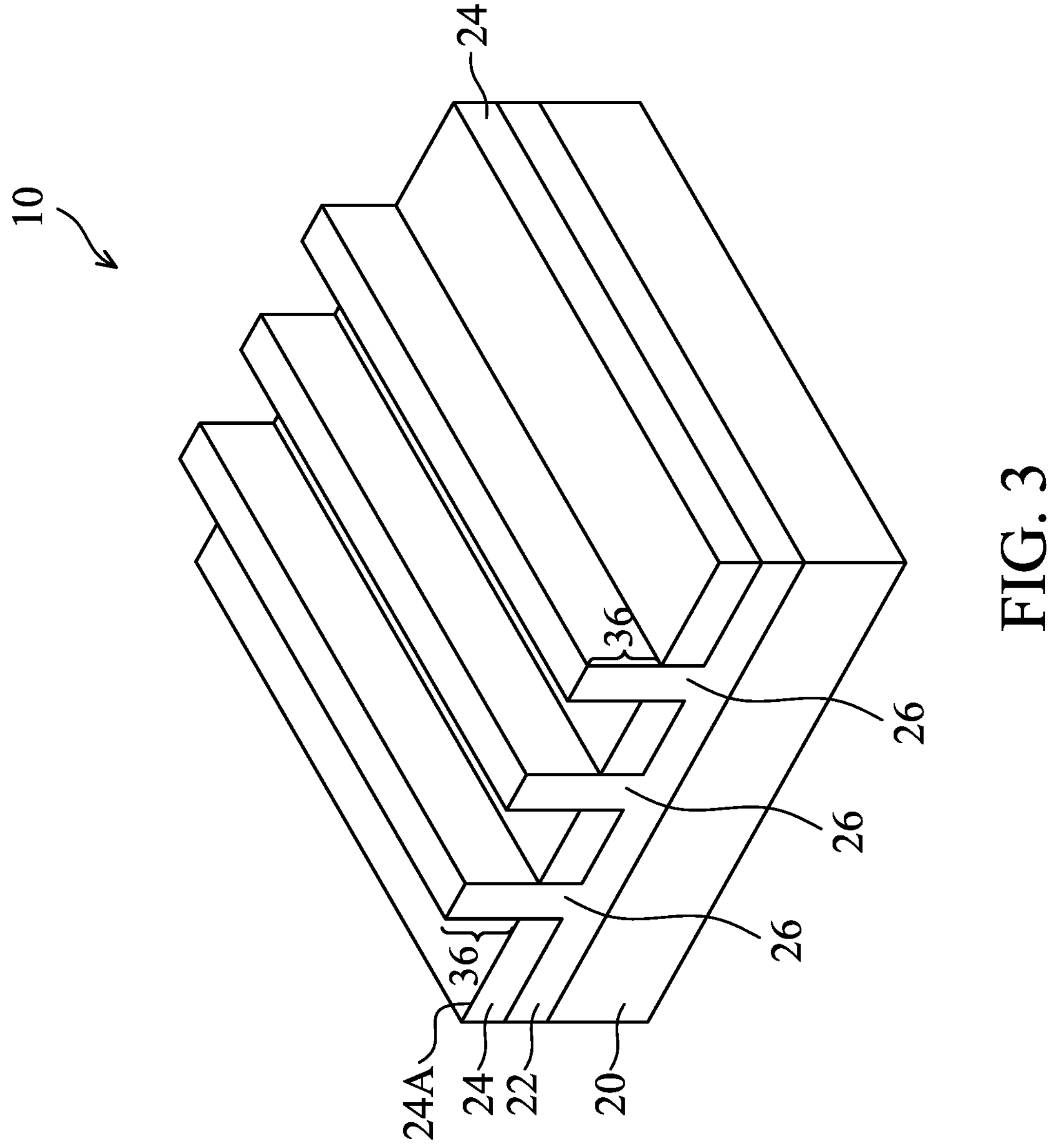

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 306 in the process flow 300 shown in FIG. 17. Pad oxide layers 28 are also removed. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
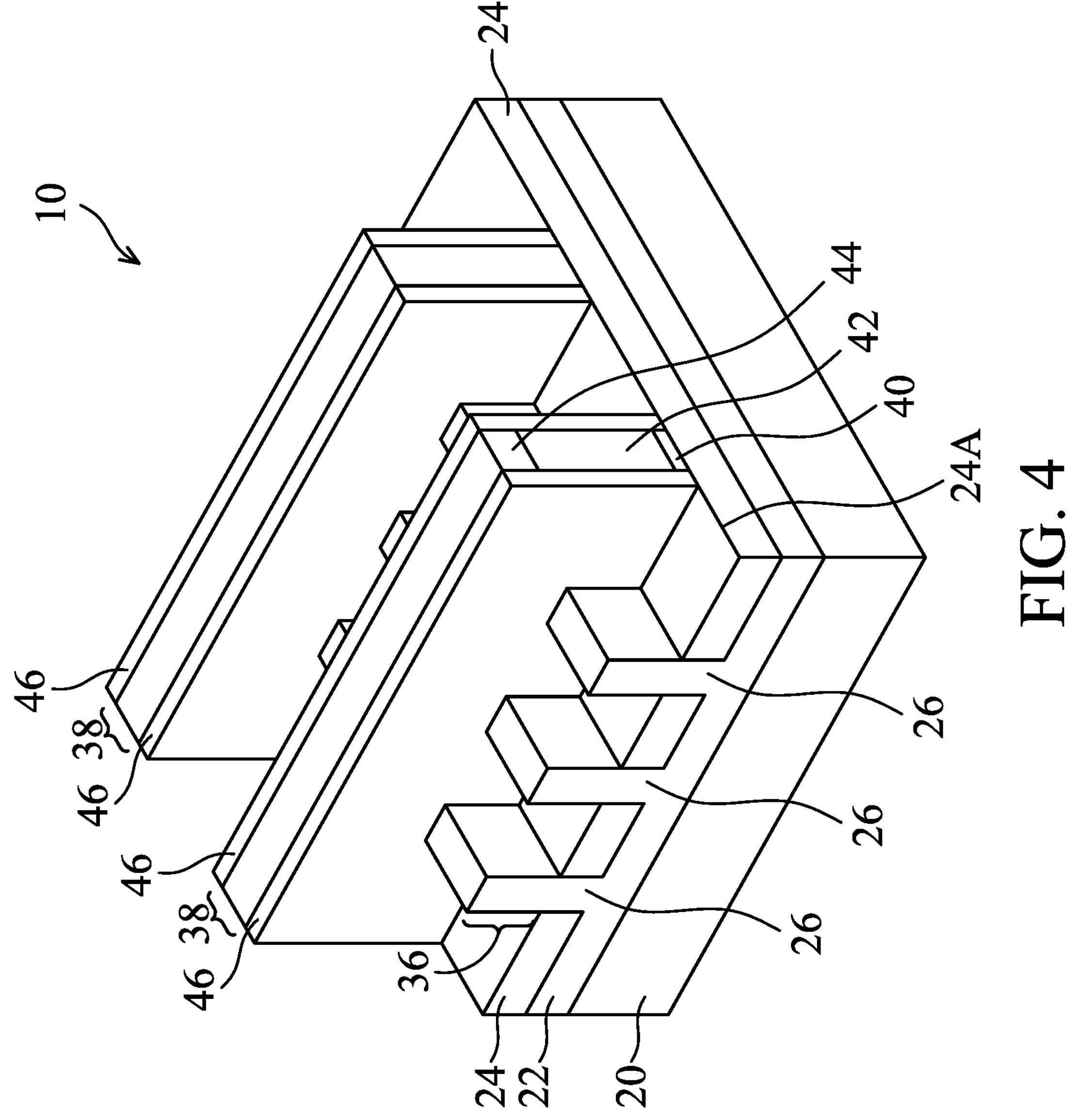

Referring to FIG. 4, dummy gate stacks 38 are formed to extend on the top surfaces and the sidewalls of (protruding) fins 36. The respective process is illustrated as process 308 in the process flow 300 shown in FIG. 17. Dummy gate stacks 38 may include dummy gate dielectrics 40 and dummy gate electrodes 42 over dummy gate dielectrics 40. Dummy gate dielectrics 40 may be formed of silicon oxide or like materials. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 308 in the process flow 300 shown in FIG. 17. In accordance with some embodiments of the present disclosure, gate spacers 46 are formed of a low-k dielectric material(s) such as porous silicon oxynitride, porous silicon carbo-nitride, porous silicon nitride, or the like, and may have a single-layer structure or a multi-layer structure including a plurality of dielectric layers. The dielectric constant (k value) of gate spacers 46 is lower than 3.8, and may be lower than about 3.0, for example, in the range between about 2.5 and about 3.0.

Figure 5:
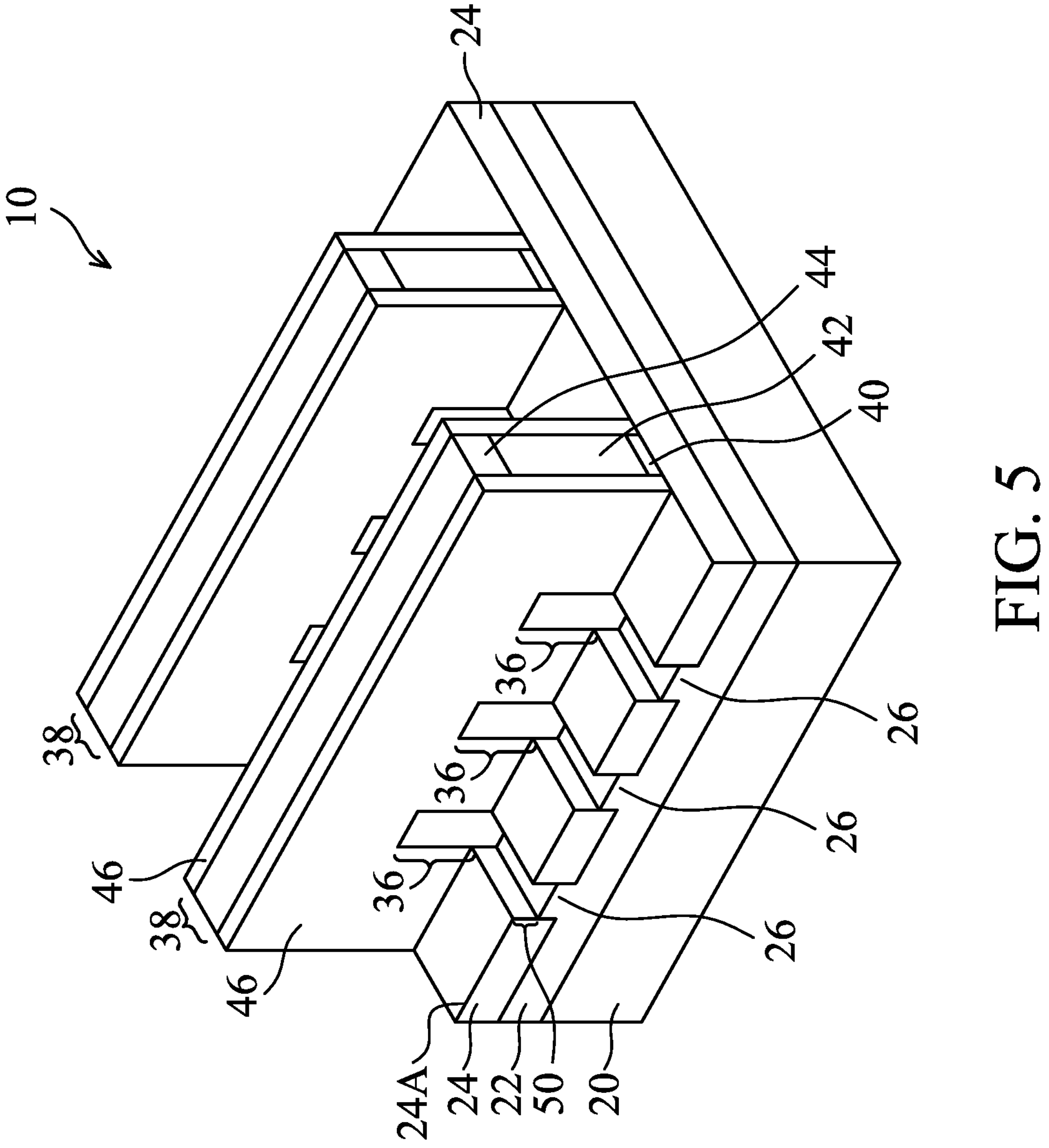

An etching process is then performed to etch the portions of protruding fins 36 that are not covered by dummy gate stacks 38 and gate spacers 46, resulting in the structure shown in FIG. 5. The respective process is illustrated as process 310 in the process flow 300 shown in FIG. 17. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
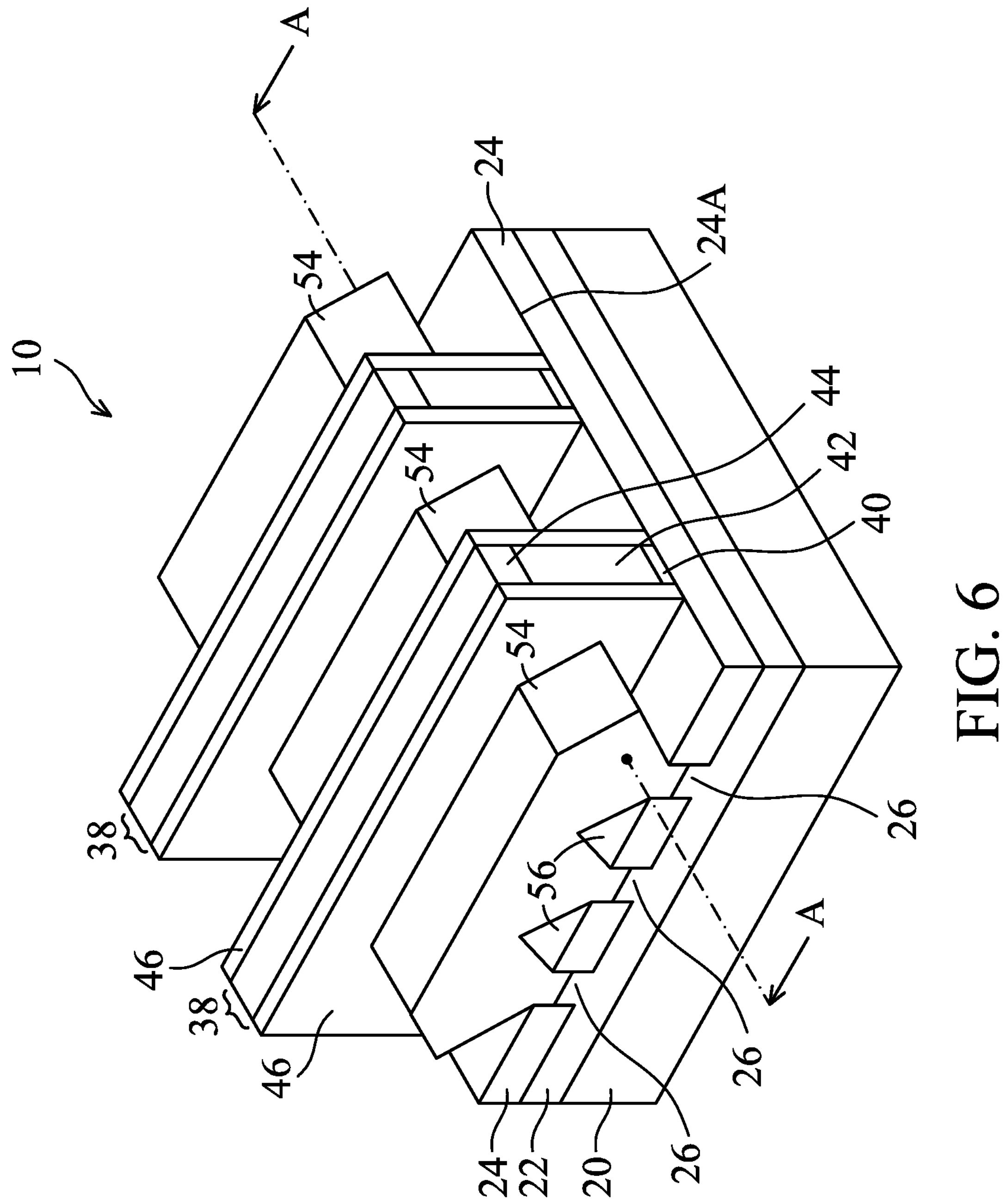

Next, epitaxy regions (source/drain regions) 54 are formed by selectively growing (through epitaxy) a semiconductor material in recesses 50, resulting in the structure in FIG. 6. The respective process is illustrated as process 312 in the process flow 300 shown in FIG. 17. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of the merged epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
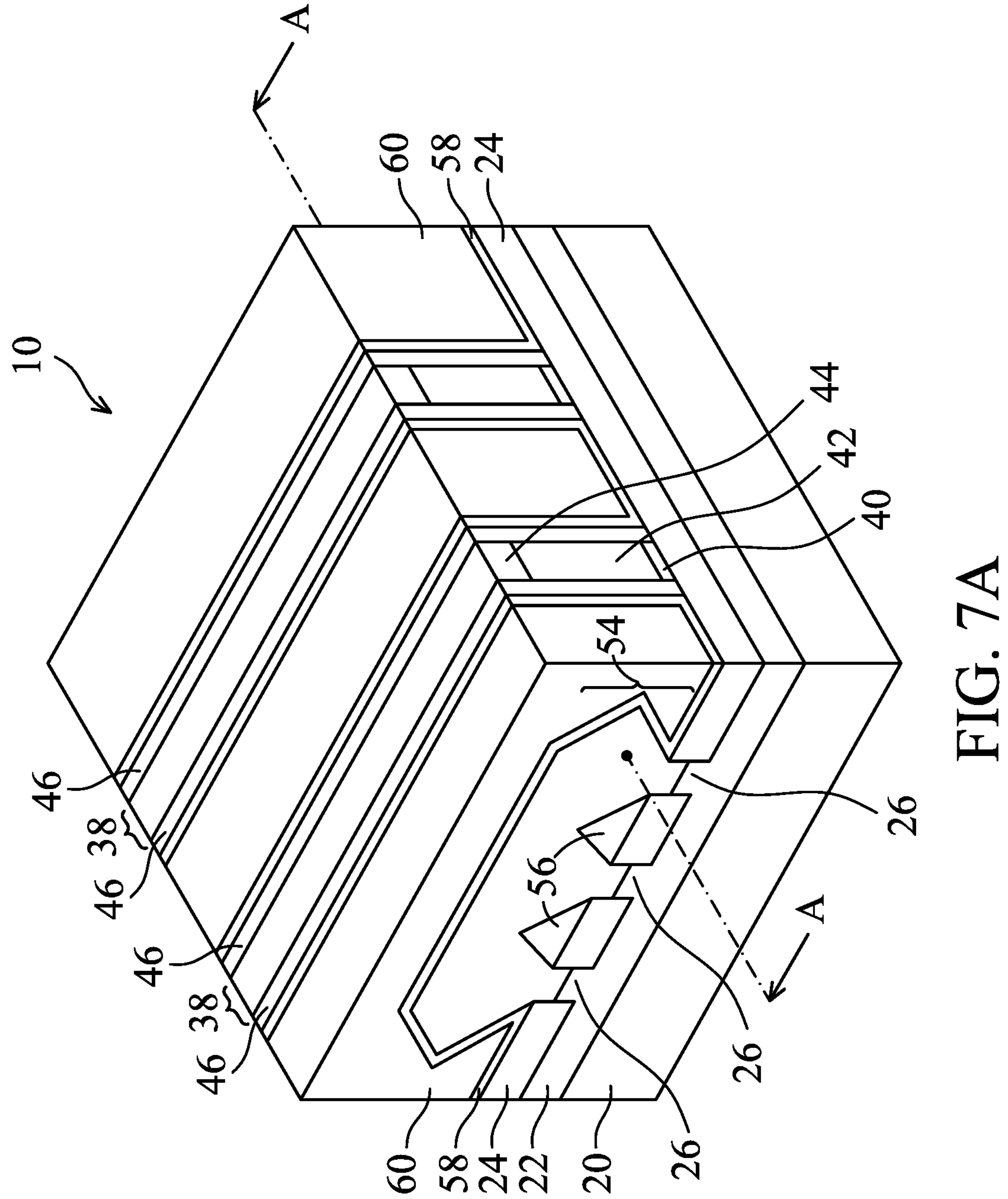

FIG. 7A illustrates a perspective view of the structure after the formation of Contact Etch Stop Layer (CESL) 58 and Inter-Layer Dielectric (ILD) 60. The respective process is illustrated as process 314 in the process flow 300 shown in FIG. 17. CESL 58 may be formed of silicon nitride, silicon oxide, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
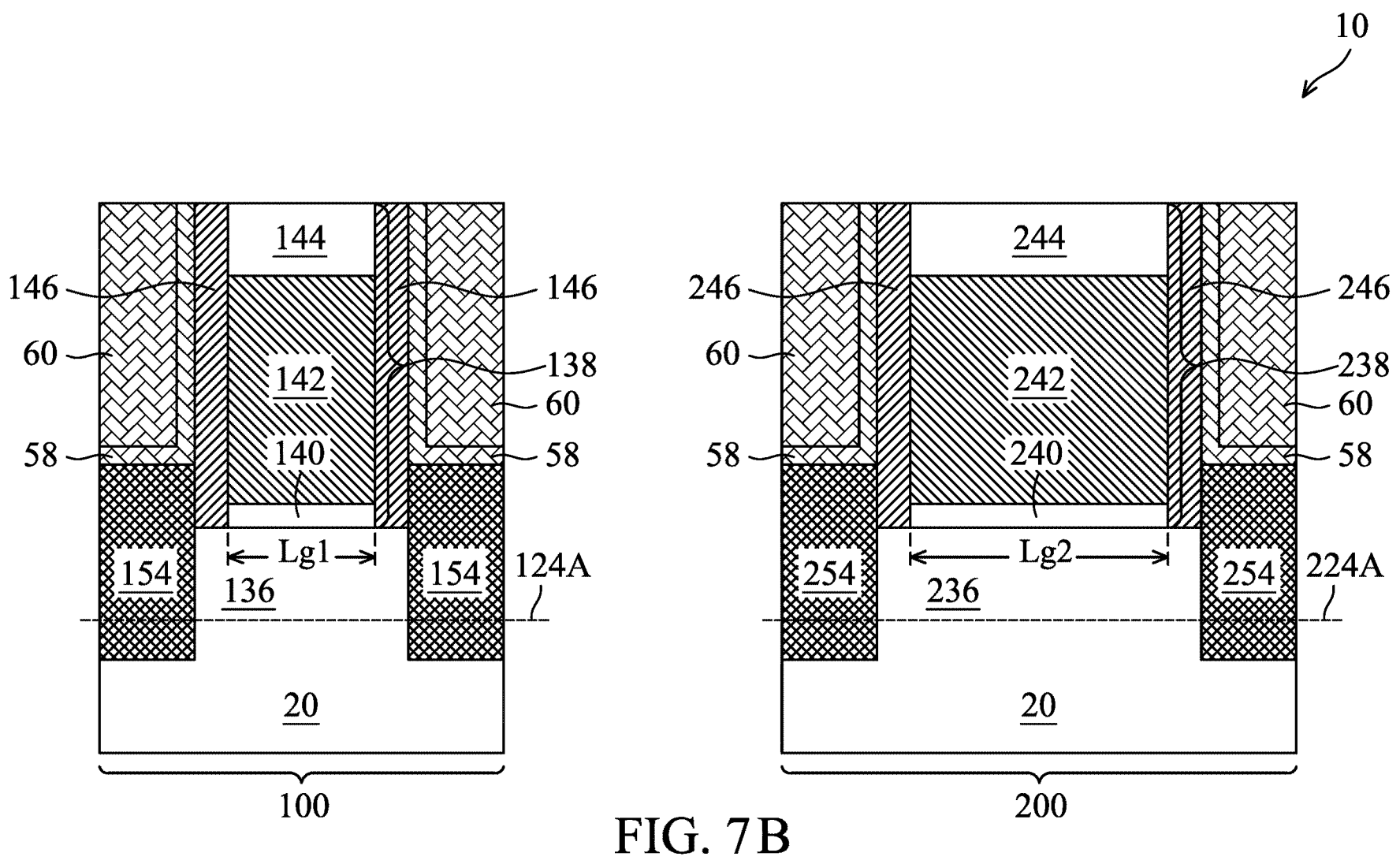

FIG. 7B illustrates the cross-sectional views of an intermediate structure in the formation of a shorter-channel device and a longer-channel device (which may be FinFETs) on same substrate 20. The shorter-channel device is formed in device region 100, and the longer-channel device is formed in device region 200. The shorter-channel device has a channel length Lg1 smaller than the channel length Lg2 of the longer-channel device, as illustrated. The ratio Lg2/Lg1 may be greater than about 1.5 or 2.0 in accordance with some embodiments, and the ratio Lg2/Lg1 may be in the range between about 1.5 and about 10. In accordance with some embodiments of the present disclosure, the channel length Lg1 of the shorter-channel device may be smaller than about 30 nm, and the channel length Lg2 of the longer-channel device may be greater than about 45 nm. In accordance with some embodiments, the shorter-channel device is a core transistor or a transistor in other circuits such as Static Random Access Memories (SRAM), and the longer-channel device is a transistor in a driver circuit, a peripheral circuit, or the like. The cross-sectional view of either one of the shorter-channel device and the longer-channel device may correspond to the cross-sectional view obtained from the vertical plane containing line A-A in FIG. 7A.

To distinguish the features in the shorter-channel device from the features in the longer-channel device, the features in the shorter-channel device are represented using the reference numerals of the corresponding features in FIG. 7A plus number 100, and the features in the longer-channel device are represented using the reference numerals of the corresponding features in FIG. 7A plus number 200. For example, the source/drain regions 154 and 254 in FIG. 7B correspond to source/drain region 54 in FIG. 7A. The gate spacers in the shorter-channel device region and the longer-channel device region are denoted as 146 and 246, which correspond to the gate spacers 46 in FIG. 7A, respectively. The corresponding features in the shorter-channel device and the longer-channel device may be formed in common processes, with some of the example processes discussed in preceding and subsequent paragraphs.

After the structures shown in FIGS. 7A and 7B are formed, the dummy gate stacks 138 and 238 are replaced with metal gates and replacement gate dielectrics, as shown in FIGS. 8A, 8B and 9-14. In FIGS. 8B and 9-14, the top surfaces 124A and 224A of STI regions 24 are illustrated, and semiconductor fins 136 and 236 protrude higher than top surfaces 124A and 224A, respectively.

Figure 8A:
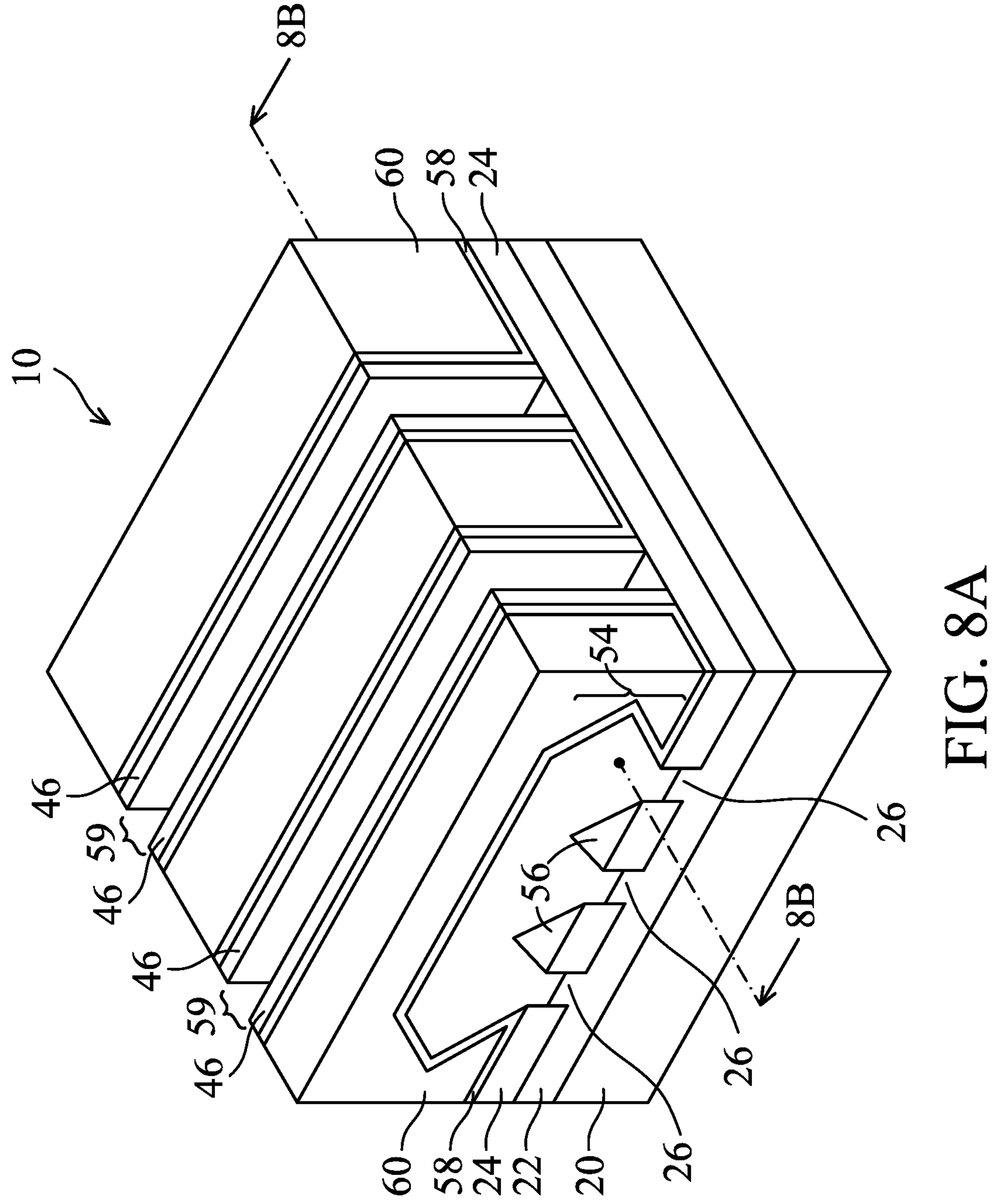
Figure 8B:
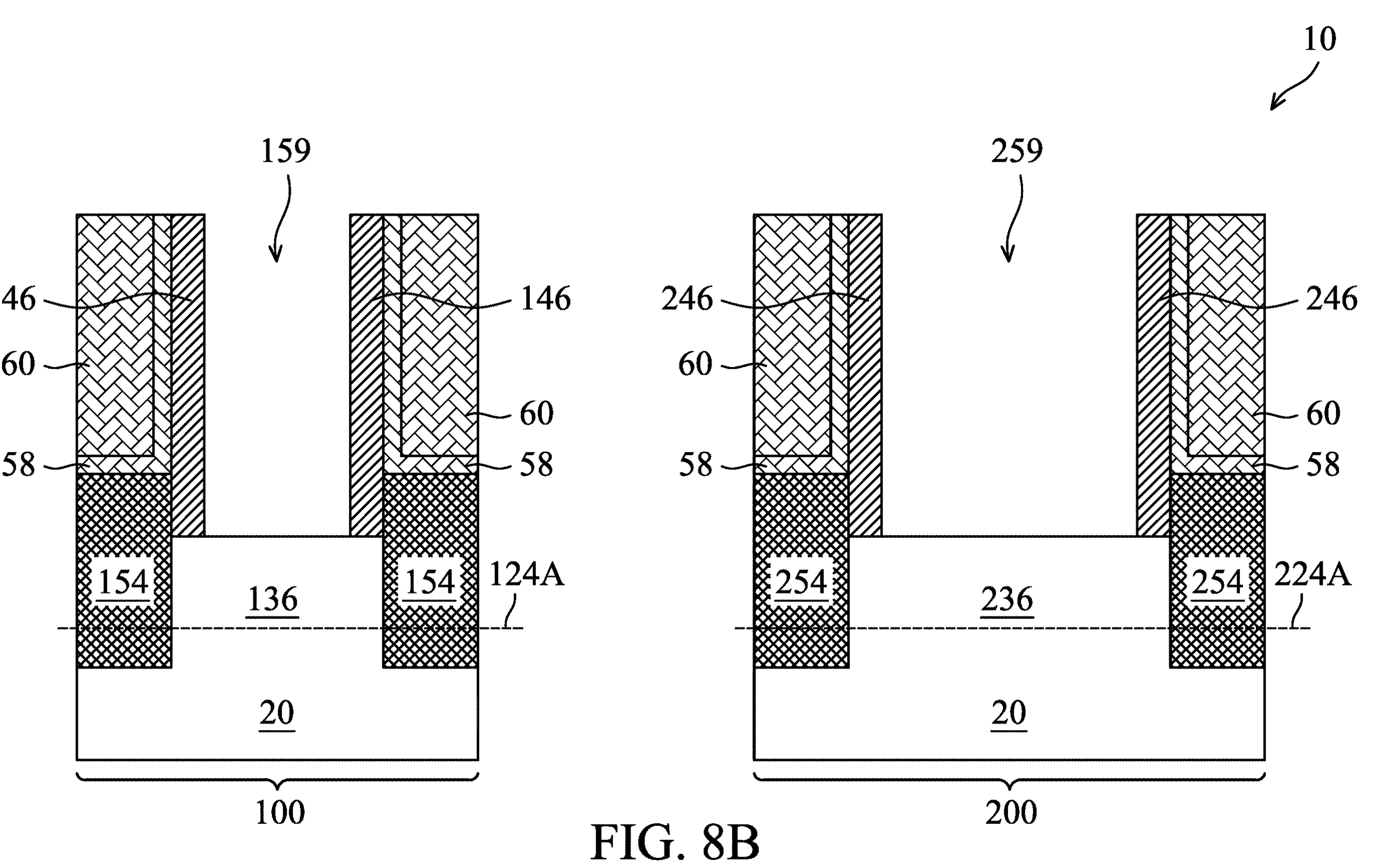

To form the replacement gates, hard mask layers 144 and 244, dummy gate electrodes 142 and 242, and dummy gate dielectrics 140 and 240 as shown in FIG. 7B are removed first, forming openings 159 and 259 as shown in FIG. 8B. The respective process is illustrated as process 316 in the process flow 300 shown in FIG. 17. Openings 59 in FIG. 8A correspond to opening 159 in device region 100 and opening 259 in device region 200. The top surfaces and the sidewalls of protruding fins 136 and 236 are exposed to openings 159 and 259, respectively.

Next, referring to FIG. 9, gate dielectrics 162 and 164 (referred to as 162/164 hereinafter) and gate dielectrics 262 and 264 (referred to as 262/264 hereinafter) are formed, which extend into openings 159 and 259, respectively. The respective process is illustrated as process 318 in the process flow 300 shown in FIG. 17. In accordance with some embodiments of the present disclosure, the gate dielectrics include Interfacial Layers (ILs) 162 and 262, which are formed on the exposed surfaces of protruding fins 136 and 236, respectively. ILs 162 and 262 may include oxide layers such as silicon oxide layers, which are formed through the thermal oxidation of protruding fins 136 and 236, a chemical oxidation process, or a deposition process. The gate dielectrics may also include high-k dielectric layers 164 and 264 over the corresponding ILs 162 and 262. High-k dielectric layers 164 and 264 may be formed of a high-k dielectric material such as hafnium oxide, lanthanum oxide, aluminum oxide, zirconium oxide, combinations thereof, multi-layers thereof, or the like. The dielectric constant (k-value) of the high-k dielectric material is higher than 3.9, and may be higher than about 7.0, and sometimes as high as 21.0 or higher. High-k dielectric layers 164 and 264 are overlying, and may contact, the respective underlying ILs 162 and 262. High-k dielectric layers 164 and 264 are formed as conformal layers, and extend on the sidewalls of protruding fins 136 and 236 and the top surface and the sidewalls of gate spacers 146 and 246, respectively. In accordance with some embodiments of the present disclosure, high-k dielectric layers 164 and 264 are formed using ALD, CVD, or the like. High-k dielectric layers 164 and 264 may be portions of the same dielectric layer, and are formed simultaneously with the same material and the same thickness, or separately with different materials and/or different thicknesses.

In accordance some embodiments, adhesion layers (which is also a diffusion barrier layer) 166 and 266 are formed over high-k dielectric layers 164 and 264. Adhesion layers 166 and 266 may be formed of TiN or Titanium Silicon Nitride (TSN). The TiN layer may be formed using ALD or CVD, and the TSN layer may include alternatingly deposited TiN layers and SiN layers, which are formed using ALD, for example. Since the TiN layers and SiN layers are very thin, these layers may not be able to be distinguished from each other, and are hence referred to as a TSN layer. In accordance with alternative embodiments, adhesion layers 166 and 266 are not formed, and the subsequently formed work-function layers 168 and 268 are in contact with the corresponding underlying high-k dielectric layers 164 and 264.

Figure 9:
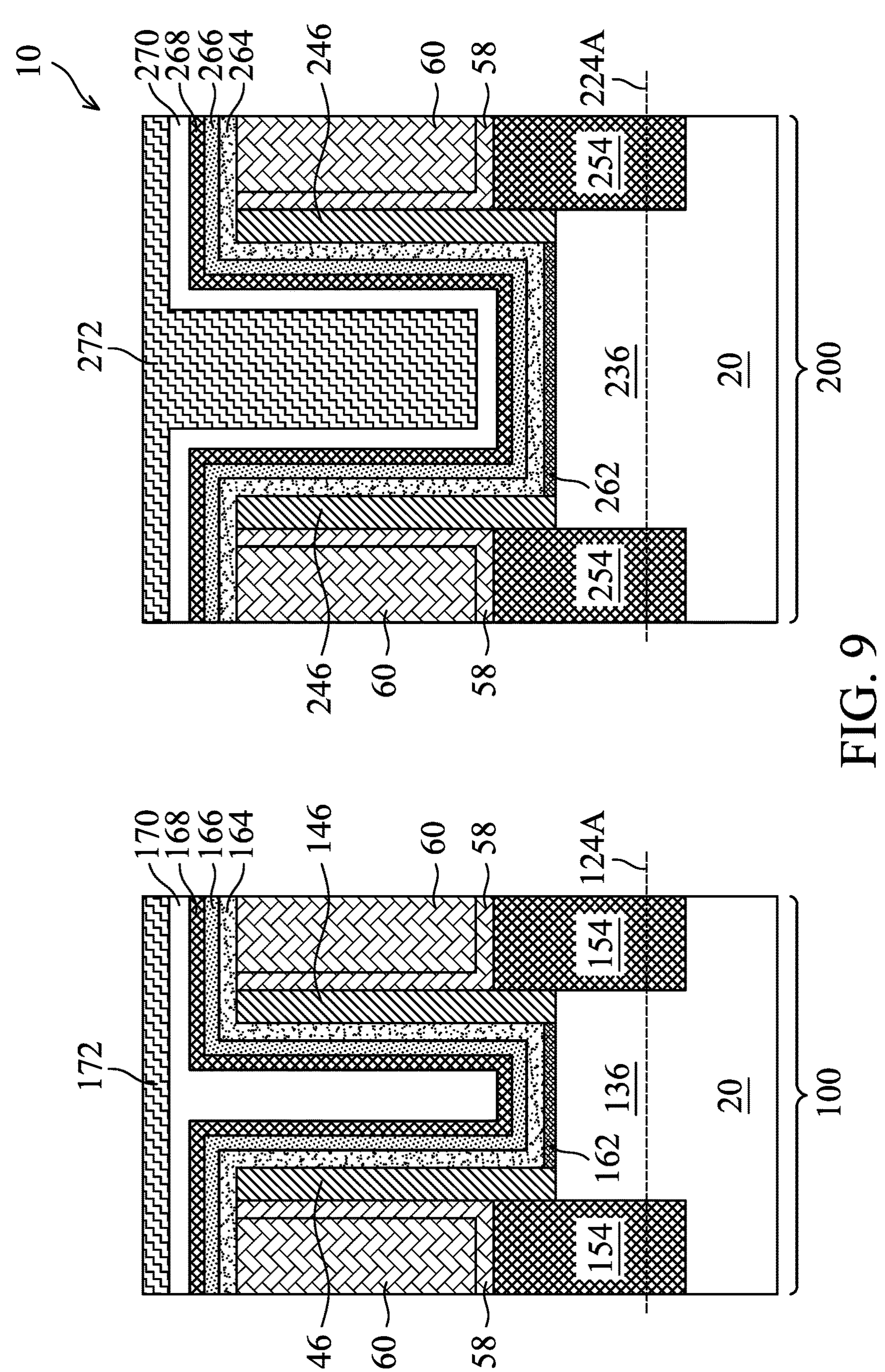

Further referring to FIG. 9, work-function layers 168 and 268 are formed through deposition. The respective process is illustrated as process 320 in the process flow 300 shown in FIG. 17. Each of work-function layers 168 and 268 includes at least one homogenous layer having an entirety formed of a same material, or may include a plurality of sub layers formed of materials different from each other. The corresponding layers in work-function layers 168 and 268 may be, or may not be, formed in common deposition processes. The specific materials of the layers in work-function layers 168 and 268 may be selected according to whether the respective FinFETs formed in device regions 100 and 200 are n-type FinFETs or p-type FinFETs. For example, when the FinFETs are n-type FinFETs, each of work-function layers 168 and 268 may include an n-work-function layer, which includes a titanium nitride (TiN) layer, a tantalum nitride (TaN) layer, an Al-based layer (formed of, for example, TiAl, TiAlN, TiAlC, TaAlN, TaAl, or TaAlC), WC, combinations thereof, and multiple layers thereof. When the FinFETs are p-type FinFETs, the corresponding work-function layers 168 and 268 may include a p-work-function layer such as a TiN layer, a tungsten carbon nitride layer ($W_xC_yN_z$), or the like. It is appreciated that $W_xC_yN_z$ can be either an n-work-function layer or a p-work-function layer, depending on the ratios of tungsten, carbon, and nitrogen. For example, when value z is close to zero, the respective $W_xC_yN_z$ layer is an n-work-function layer. A $W_{0.55}C_{0.12}N_{0.28}O_{0.05}$ layer, on the other hand, is a p-work-function layer. In accordance with some embodiments, a work function layer of an n-type FinFET may also include an n-work-function layer and a p-work-function layer over the n-work-function layer, wherein the n-work-function layer dominates the work function of the respective FinFET. Similarly, a work function layer of a p-type FinFET may also include a p-work-function layer and an n-work-function layer over the p-work-function layer, wherein the p-work-function layer dominates the work function of the respective FinFET. In accordance with other embodiments, a FinFET has a single homogeneous work function layer.

In accordance with some embodiments of the present disclosure, blocking layers 170 and 270 (which are also adhesion layers) are formed over work-function layers 168 and 268, respectively. The respective process is also illustrated as process 320 in the process flow 300 shown in FIG. 17. Blocking layers 170 and 270 may be metal-containing layers, which may be formed of TiN in accordance with some embodiments. The material of blocking layers 170 and 270 may have a high-resistivity, and hence are also referred to as high-resistivity conductive layers. Other materials such as TaN may also be used. In accordance with some embodiments, blocking layers 170 and 270 are formed using ALD, CVD, or the like. Blocking layers 170 and 270 may be portions of the same metal-containing layer, which are formed simultaneously with the same material and having the same thickness, or formed separately using different materials and/or having different thicknesses.

In accordance with some embodiments, blocking layer 170 fully fills the remaining opening 159 (FIG. 8B) since opening 159 is narrow. On the other hand, blocking layer 270 in FIG. 9 partially fills the remaining opening 259 (FIG. 8B) since opening 259 is wider.

Next, a gap-filling process is performed to fill the remaining opening 259 with metal layer 272, which fully fills opening 259. In the same process in which metal layer 272 is formed, metal layer 172 is also deposited. Since opening 159 has been fully filled, metal layer 172 is deposited over blocking layer 170 and outside of opening 159 (FIG. 8B). In accordance with some embodiments, the formation of metal layers 172 and 272 include growing a nucleation layer, for example using ALD, followed by a deposition process using another method such as CVD. Metal layers 172 and 272 may be formed of a low-resistance conductive material (which may be a metal) such as tungsten, cobalt, or combinations thereof. In an example process in which tungsten is used, the process gas may include $WF_6$ and $H_2$, and some carrier gases such as argon.

Figure 10:
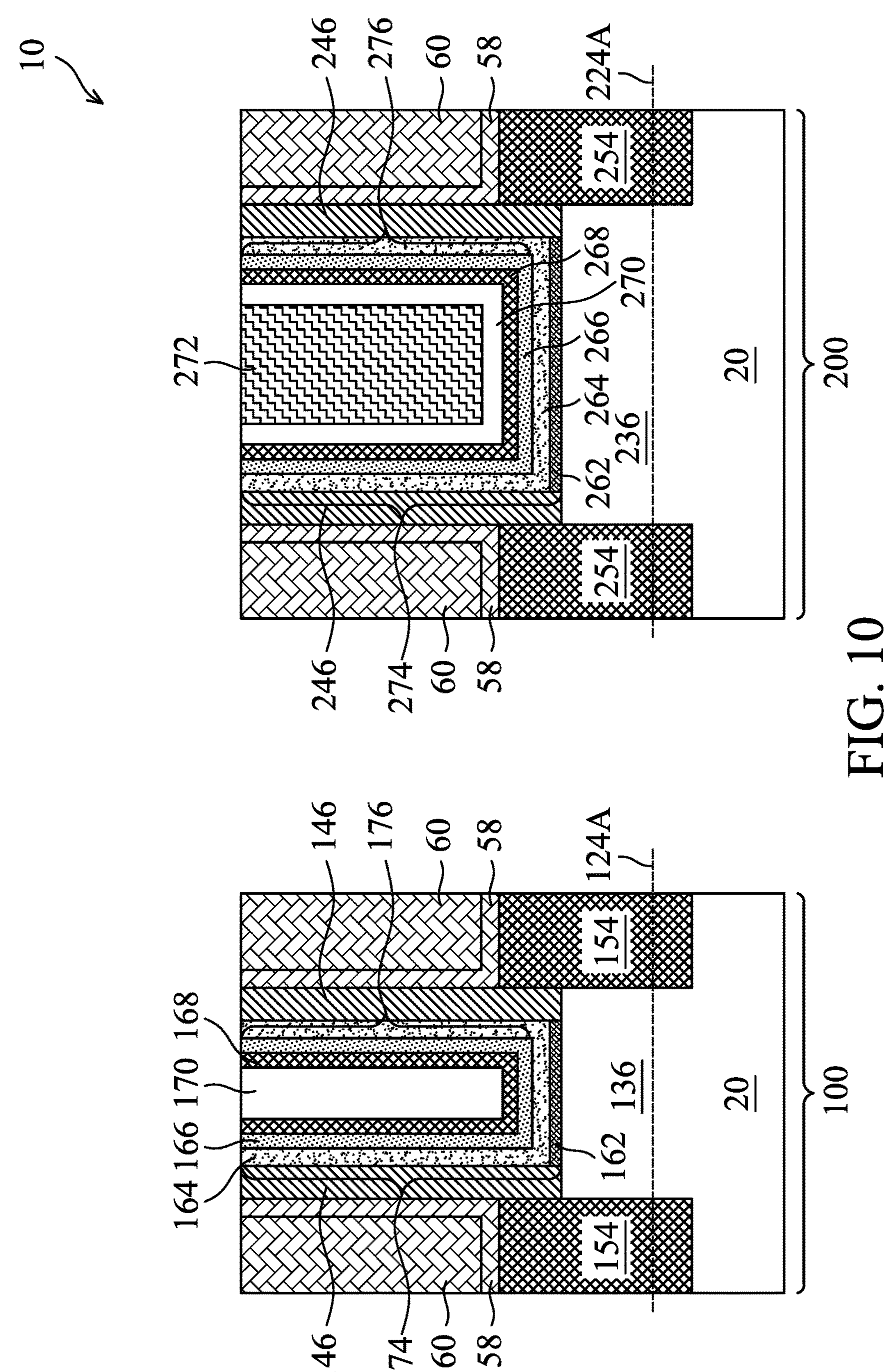

After the formation of metal layers 172 and 272, a planarization process such a Chemical Mechanical Polish (CMP) process or a mechanical polish process is performed to remove excess portions of the deposited layers as shown in FIG. 9, resulting in the gate stacks 174 and 274 as shown in FIG. 10. Gate stacks 174 and 274 include gate dielectrics 162/164 and 262/264, respectively, and gate electrodes 176 and 276, respectively.

Figure 11:
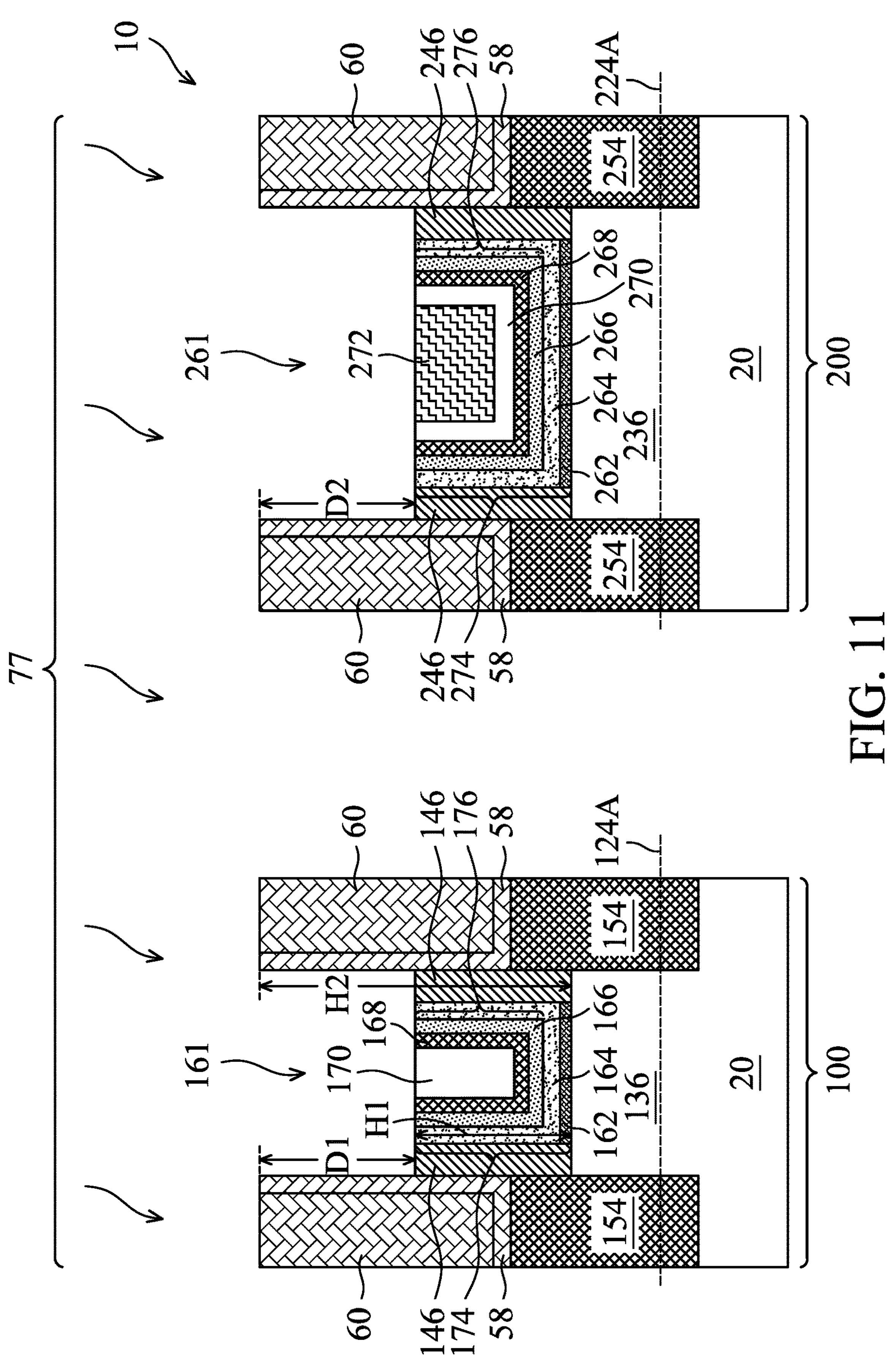

FIG. 11 illustrates a first etch-back process performed on gate stacks 174 and 274 and gate spacers 146 and 246, wherein the etching is represented by arrows 77. The respective process is illustrated as process 322 in the process flow 300 shown in FIG. 17. Recesses 161 and 261 are generated accordingly. The first etch-back process may include a dry etch process and/or a wet etch process. Furthermore, the etching may be isotropic or anisotropic. In accordance with some embodiments of the present disclosure, the etch-back process is performed using an etchant that etches gate spacers 146 and 246 and gate stacks 174 and 274, and does not etch CESL 58 and 60. In accordance with some embodiments when a dry etching process is used, the etching gases includes a F-based etchant such as $CF_4$, $C_2F_6$, $NF_3$, or the like, or combinations thereof. In accordance with some embodiments when a wet etching process is used, the etching chemical may include diluted HF solution, $NH_4OH$ (ammonia solution), or combinations thereof. In accordance with some embodiments, after the first etch-back process, the height of gate stacks 174 (or 274) is H1, which may be in the range between about 8 nm and about 16 nm. The vertical distance from the top surface of protruding fins 136 (or 236) to the top surface of ILD 60 is represented as H2. The ratio H1/H2 may be in the range between about 0.1 and about 0.25. The recessing depth D1 (or D2) may be in the range between about 50 nm and about 80 nm. It is appreciated that the value of recessing depth D1 cannot be too high or too low. If the value is too high, some parts (such as horizontal parts) of gate stacks 174 and 274 may be adversely removed, causing device failure. If the value is too low, not enough recess is generated to accommodate the subsequent filling of low-resistivity conductive layers.

Figure 12:
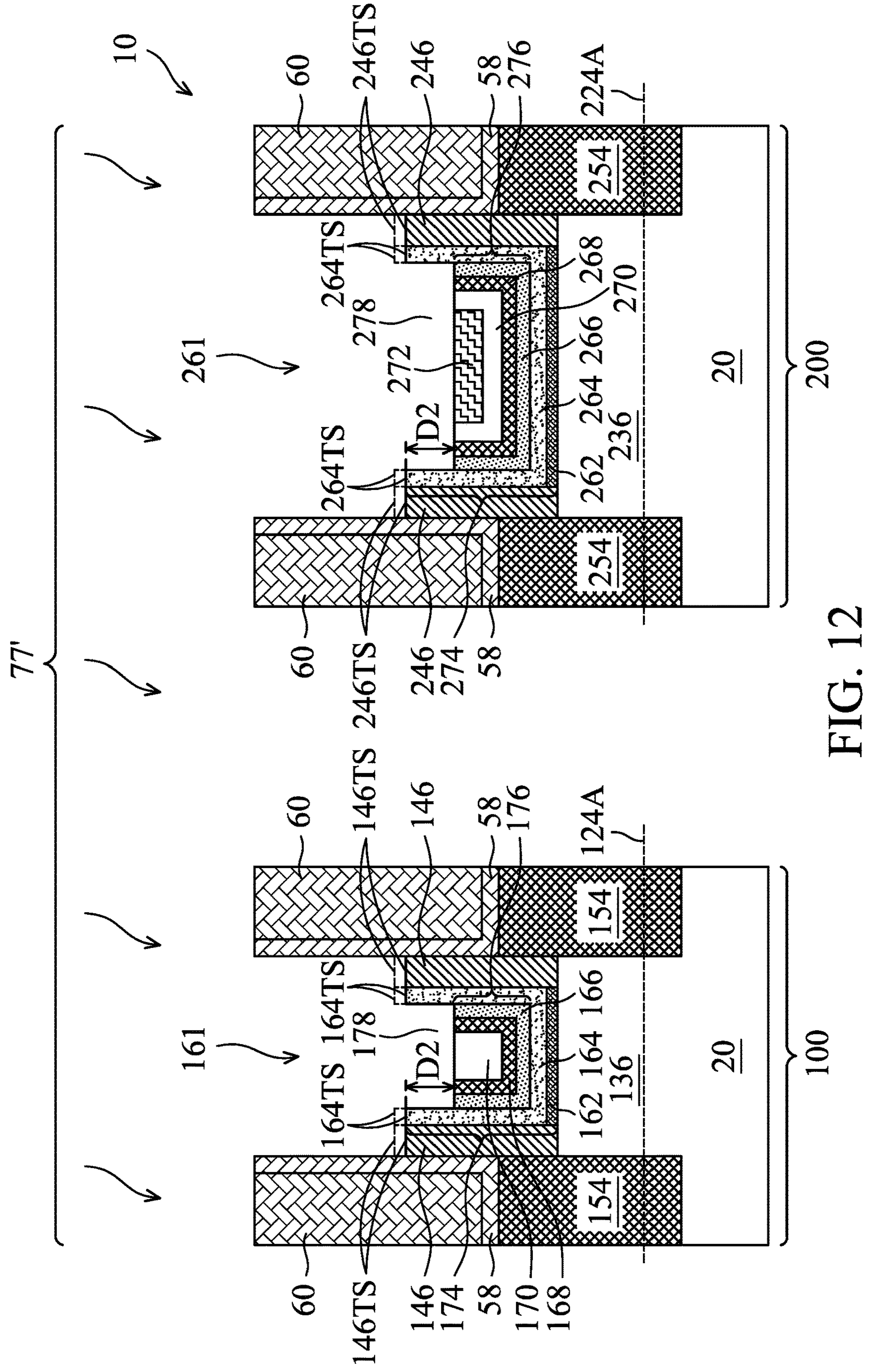

After the first etch-back process as shown in Figure ii, a second etch-back process is performed, as shown in FIG. 12, wherein the etching is represented by arrows 77'. The respective process is illustrated as process 324 in the process flow 300 shown in FIG. 17. Recesses 178 and 278 are thus formed between the opposing portions of the corresponding high-k dielectric layers 164 and 264. The second etch-back process is performed using an etching gas or an etching chemical solution different from that used in the first etch-back process. The second etch-back process may include a dry etch process and/or a wet etch process. Furthermore, the etching may be isotropic or anisotropic. In accordance with some embodiments of the present disclosure, the second etch-back process is performed using an etchant that etches gate electrodes 176 and 276, and does not etch gate spacers 146 and 246, high-k dielectric layers 164 and 264, CESL 58, and ILD 60. In accordance with some embodiments when a dry etching process is used, the etching gases may include $BCl_3$, $Cl_2$, $WF_6$, or combinations thereof. In accordance with some embodiments in which a wet etching process is used, the etching chemical may include $NH_4OH$ or the like. In accordance with some embodiments, the recessing depth D2 may be in the range between about 2 nm and about 10 nm. It is appreciated that the value of recessing depth D2 also cannot be too high or too low. If the value is too high, some parts of gate electrodes 176 and 276 may be adversely removed, causing device failure. If the value is too low, not enough recess is generated to accommodate the subsequent filling of low-resistivity layers.

Due to the selectivity of the etchant on different materials, the top surfaces 146TS of gate spacers 146 may be level with, higher than, or lower than, the top surfaces 164TS of high-k dielectric layers 164. Similarly, the top surfaces 246TS of gate spacers 246 may be level with, higher than, or lower than, the top surfaces 264TS of high-k dielectric layers 264. The height difference between top surfaces 164TS and the neighboring top surfaces 264TS of the same FinFET, however, is low, for example, smaller than about 2 nm or about 1 nm. Some possible example positions of top surfaces 146TS, 164TS, 246TS, and 264TS are shown using dashed lines.

Figure 13:
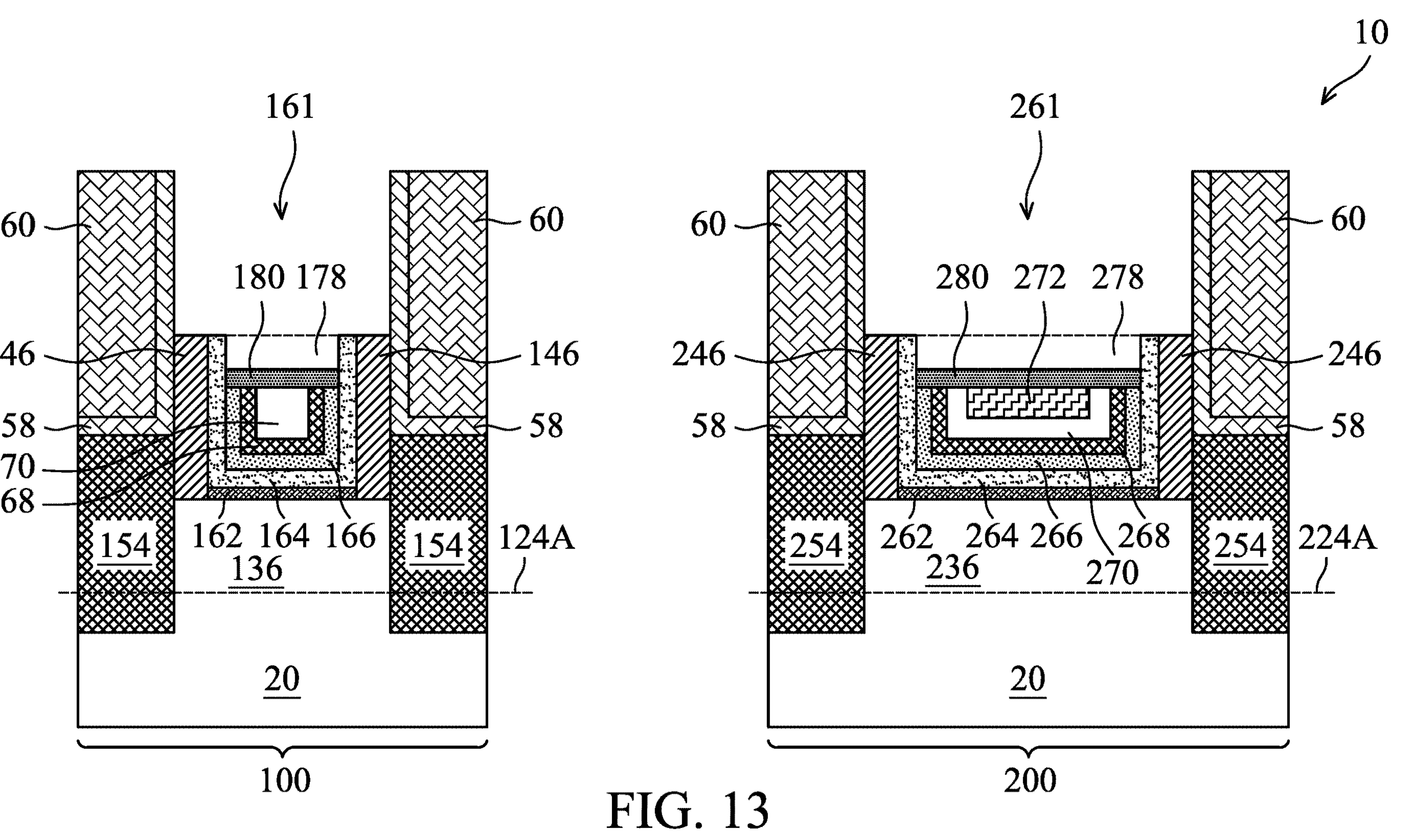

Referring to FIG. 13, low-resistivity conductive layers 180 and 280, which may be metal layers, are formed using a selective deposition process. Throughout the description, low-resistivity conductive layers 180 and 280 may also be considered as parts of the respective gate electrodes. In accordance with some embodiments of the present disclosure, low-resistivity conductive layers 180 and 280 are formed of Molybdenum (Mo), tungsten (W), cobalt, alloys thereof, or the like The respective process is illustrated as process 326 in the process flow 300 shown in FIG. 17. The resistivity of the low-resistivity conductive layers 180 and 280 are lower than the resistivity of the layers (which include layers 166, 266, 168, 268, 170, and 270) in gate electrodes 176 and 276. Low-resistivity conductive layers 180 and 280 are formed on gate electrodes 176 and 276, respectively, and not on the exposed surfaces of gate spacers 146 and 246, high-k dielectric layers 164 and 264, CESL 58, and ILD 60. In accordance with some exemplary embodiments, the deposition is performed using ALD or CVD. The precursor may include a metal halide (such as $WCl_3$) and a reducing agent such as $H_2$. The deposition process may be a thermal process performed at an elevated temperature, such as in the range between about 275° C. and about 500° C. The deposition may also be performed with plasma turned on.

Due to the selective deposition, low-resistivity conductive layers 180 and 280 may be conformal layers. Furthermore, low-resistivity conductive layers 180 and 280 may be substantially planar if the top surfaces of gate electrodes 176 and 276, respectively, are planar. Alternatively, low-resistivity conductive layers 180 and 280 are curved and have the topology following the top-surface profile of the respective underlying gate electrodes 176 and 276. The thickness of low-resistivity conductive layers 180 and 280 is selected so that the resistivity of low-resistivity conductive layers 180 and 280 is adequately low. For example, the thickness of low-resistivity conductive layers 180 and 280 may be in the range between about 2 nm and about 6 nm. In accordance with some embodiments, the top surfaces of low-resistivity conductive layers 180 and 280 are lower than the top surfaces (edges) of the corresponding high-k dielectric layers 164 and 264, so that the entire low-resistivity conductive layers 180 and 280 are in the corresponding recesses 178 and 278. This provides some process margin to ensure that low-resistivity conductive layers 180 and 280 will not be formed out of the recesses 178 and 278, respectively. Otherwise, low-resistivity conductive layers 180 and 280 may extend on the top surfaces of gate spacers 146 and 246 and high-k dielectric layers 164 and 264. If this happens, the subsequently formed source/drain contact plugs may be electrically shorted to low-resistivity conductive layers 180 and 280 if a process variation causes the subsequently formed source/drain contact plugs to be undesirably shifted to gate spacers 146 and 246. In accordance with alternative embodiments, the top surfaces of low-resistivity conductive layers 180 and 280, which top surfaces are illustrated using dashed lines, are planar with the top edges of the corresponding high-k dielectric layers 164 and 264, and/or the top edges of the corresponding gate spacers 146 and 246.

Figure 14:
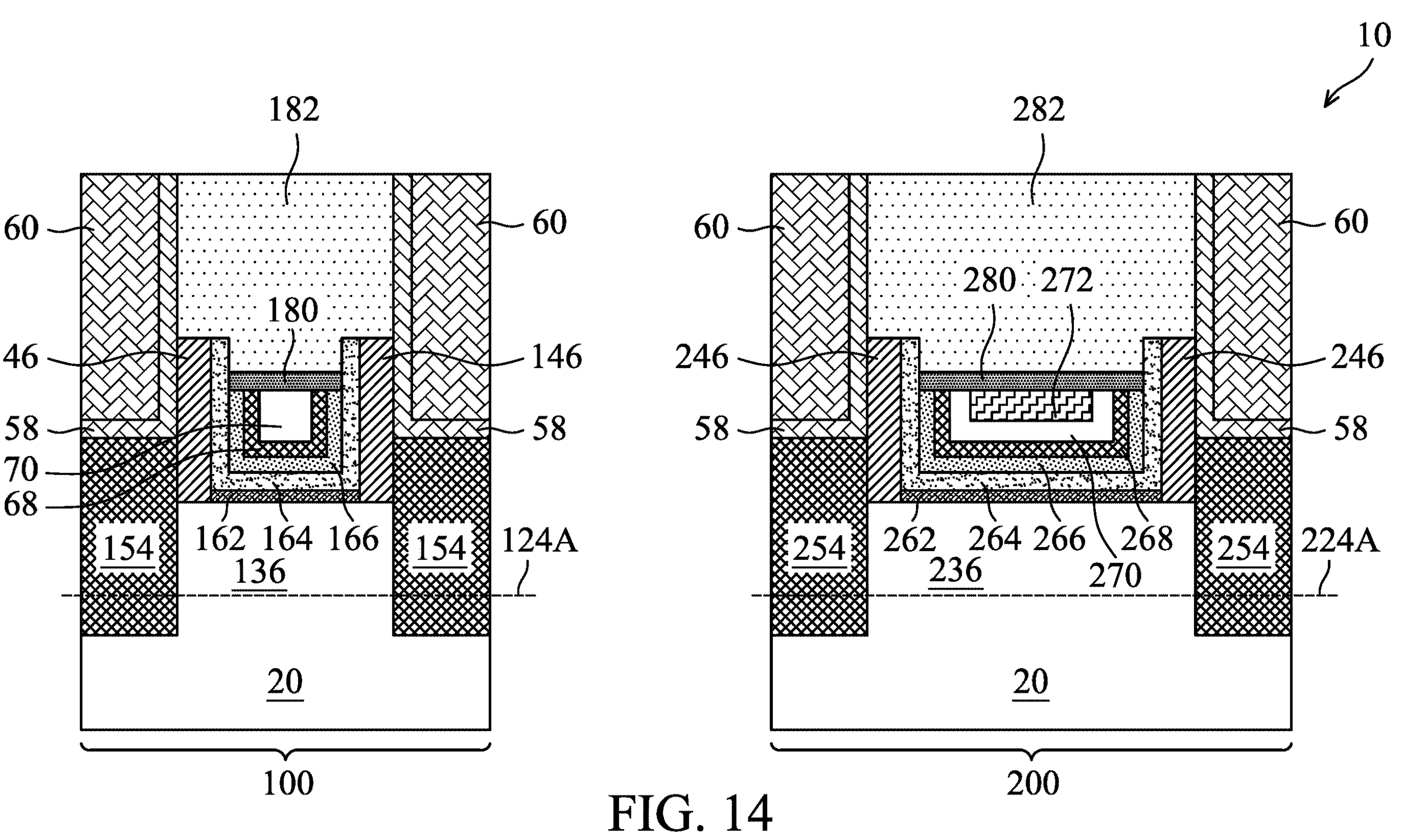

Next, the remaining openings 161/178 and 261/278 are filled with a dielectric material to form dielectric filling regions 182 and 282, as shown in FIG. 14. The respective process is illustrated as process 328 in the process flow 300 shown in FIG. 17. Dielectric filling regions 182 and 282 may be formed of a homogeneous low-k dielectric material, which may be formed of porous silicon nitride, porous silicon oxynitride, porous silicon oxy-carbide, or the like.

Dielectric filling regions 182 and 282 are also planarized so that their top surfaces are coplanar with the top surface of ILD 60. The sidewalls of dielectric filling regions 182 and 282 are in contact with the sidewalls of CESL 58.

Figure 15:
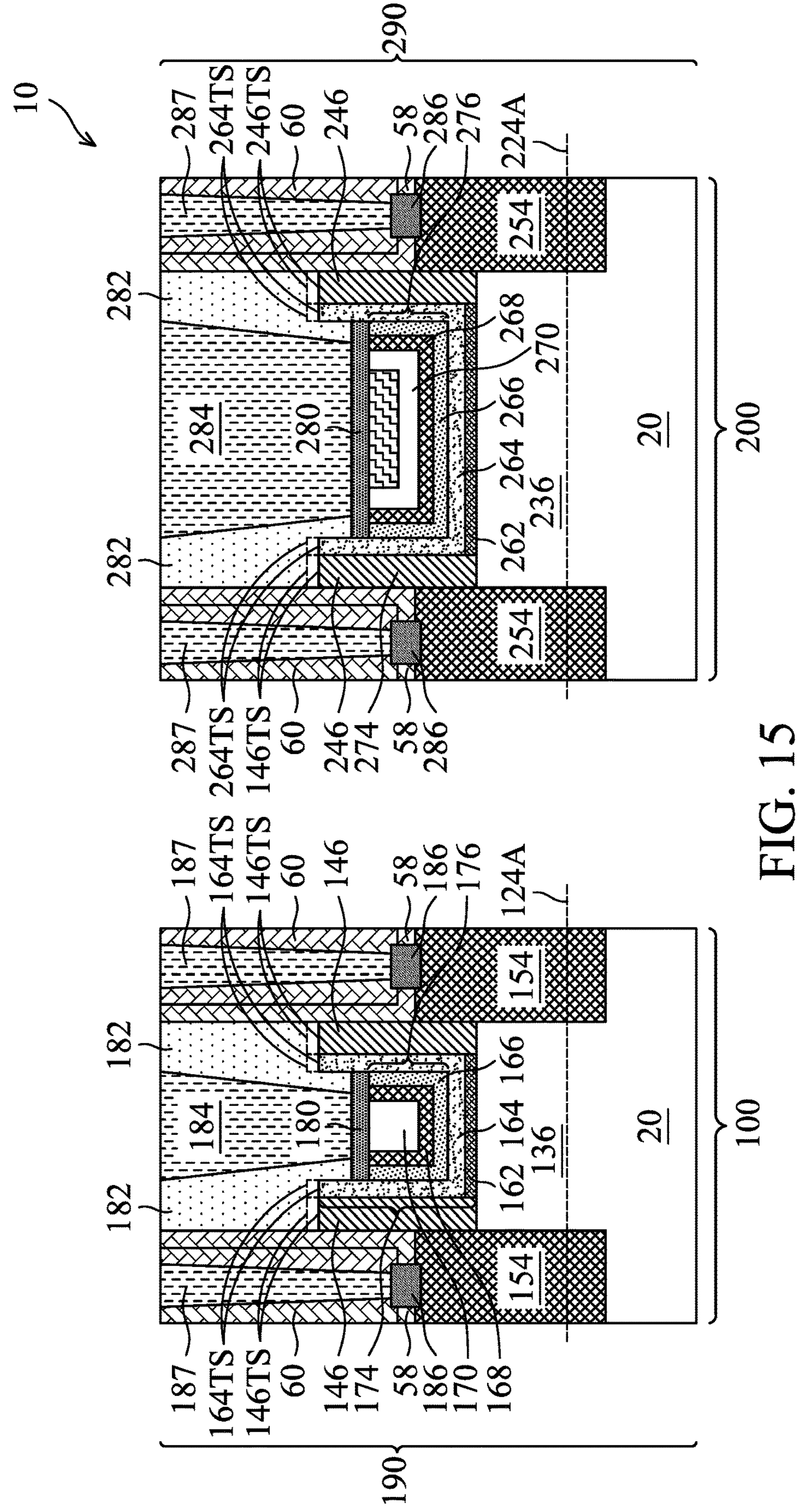

FIG. 15 illustrates the formation of gate contact plugs 184 and 284, source/drain silicide regions 186 and 286, and source/drain contact plugs 187 and 287. The respective process is illustrated as process 330 in the process flow 300 shown in FIG. 17. The formation of source/drain contact plugs 187 and 287 includes forming contact openings by etching ILD 60 to expose the underlying portions of CESL 58, and then etching the exposed portions of CESL 58 to reveal source/drain regions 154 and 254. In a subsequent process, a metal layer (such as a Ti layer) is deposited to extend into the contact openings. A metal nitride blocking layer (such as a TiN layer) may be formed. An anneal process is then performed to react the metal layer with the top portion of source/drain regions 154/254 to form silicide regions 186 and 286. Next, either the previously formed metal nitride layer is left without being removed, or the previously formed metal nitride layer is removed, followed by the deposition of a new metal nitride layer (such as a titanium nitride layer). A filling metallic material such as tungsten, cobalt, or the like, is then filled into the contact openings, followed by a planarization to remove excess materials, resulting in source/drain contact plugs 187 and 287. The formation of gate contact plugs 184 and 284 may include etching dielectric filling regions 182 and 282 to reveal low-resistivity conductive layers 180 and 280, and forming gate contact plugs 184 and 284 in the corresponding openings. Gate contact plugs 184 and 284 may also include a diffusion barrier layer (such as titanium nitride) and a metal (such as copper, tungsten, cobalt, or the like) over the diffusion barrier layer. FinFETs 190 and 290 are thus formed.

Figure 16:
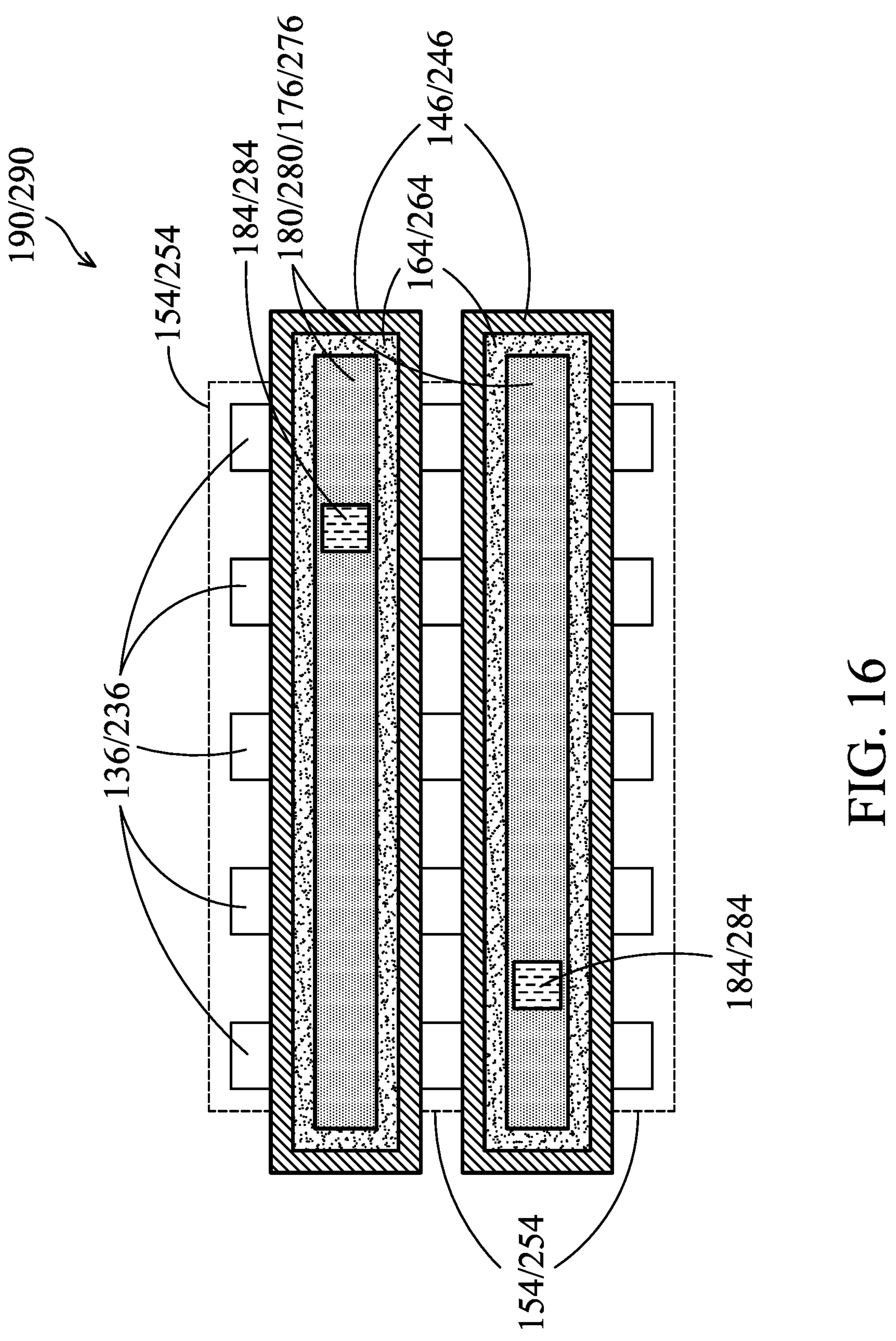
FIG. 16 illustrates a plane view of a FinFET in accordance with some embodiments.

FIG. 16 illustrates a top view of some portions of FinFET 190 or 290. Gate electrodes 176 (or 276) and the overlying low-resistivity conductive layers 180 (or 280) are illustrated. The vertical portions of high-k dielectric layers 164 (or 264) may form rings encircling the corresponding gate stacks 176 (or 276) and the corresponding overlying low-resistivity conductive layers 180 (or 280). Gate contact plugs 184 (or 284), protruding fins 136 (or 236), and source/drain regions 154 (or 254) are also illustrated.

Experiment results have revealed that by forming the low-resistivity conductive layers on gate electrodes, the gate resistance Rg of the short-channel transistors may be reduced to equal to about 10 percent of the gate resistance Rg of the short-channel transistors without the low-resistivity conductive layers. For example, sample gates are formed on silicon wafers, and the resistance values of the corresponding gate electrodes are measured. The results indicated that with the low-resistivity conductive layers formed, 100 percent of the sample gates have resistance values smaller than a first value. As a comparison, if the low-resistivity conductive layers are not formed, more than 50 percent of the gate electrodes have their resistance values higher than four times the first value.

The embodiments of the present disclosure have some advantageous features. In short-channel devices, the gate electrodes are formed of high-resistivity layers such as work-function layers and blocking layers, and there may not exist low-resistivity layers in the gate electrodes. The gate resistance Rg of the resulting gate electrodes is thus high. The performance of the corresponding transistors is thus significantly degraded. In accordance with some embodiments of the present disclosure, a low-resistivity layer is formed on the gate electrodes to reduce the gate resistance Rg.

In accordance with some embodiments of the present disclosure, a device includes a first semiconductor fin; a first gate stack on sidewalls and a top surface of the first semiconductor fin, wherein the first gate stack comprises: a high-k dielectric layer; a work-function layer overlapping a first bottom portion of the high-k dielectric layer; and a first blocking layer overlapping a second bottom portion of the work-function layer; and a first low-resistance metal layer overlapping and contacting the work-function layer and the first blocking layer, wherein the first low-resistance metal layer has a first resistivity value lower than second resistivity values of both of the work-function layer and the first blocking layer; and a first gate spacer contacting a sidewall of the first gate stack. In an embodiment, the device further includes a contact etch stop layer comprising a vertical portion contacting a sidewall of the first gate spacer, wherein the vertical portion extends higher than the first gate spacer. In an embodiment, the device further includes a dielectric filling region over and contacting the first gate spacer and the high-k dielectric layer, wherein the dielectric filling region further contacts the vertical portion of the contact etch stop layer. In an embodiment, the dielectric filling region comprises a low-k dielectric material. In an embodiment, the high-k dielectric layer has a first top edge, and the first gate spacer has a second top edge, and wherein the first top edge is higher than the second top edge. In an embodiment, the high-k dielectric layer has a first top edge, and the first gate spacer has a second top edge, and wherein the first top edge is lower than the second top edge. In an embodiment, the high-k dielectric layer has a first top edge, and the first gate spacer has a second top edge, and wherein the first top edge is level with the second top edge. In an embodiment, the device further includes a second gate stack of a transistor, the second gate stack comprising: a second blocking layer formed of a same material as the first blocking layer; a metal region between opposite vertical portions of the second blocking layer; and a second low-resistance metal layer overlapping and contacting the second blocking layer and the metal region, wherein the first low-resistance metal layer and the second low-resistance metal layer are formed of a same material.

In accordance with some embodiments of the present disclosure, a device includes a high-k dielectric layer; a work-function layer over and contacting the high-k dielectric layer; a blocking region over and contacting the work-function layer; a metal layer over and contacting the work-function layer and the blocking region, wherein the metal layer is planar, and the metal layer is free from portions extending into the blocking region; a gate spacer on a sidewall of the high-k dielectric layer; and a dielectric filling region overlapping and contacting the gate spacer, the high-k dielectric layer, and the metal layer. In an embodiment, the dielectric filling region extends between opposing portions of the high-k dielectric layer. In an embodiment, the dielectric filling region is formed of a low-k dielectric material. In an embodiment, the device further includes: a source/drain region on a side of the high-k dielectric layer; and a contact etch stop layer comprising a horizontal portion over and contacting the source/drain region, and a vertical portion contacting both of the high-k dielectric layer and the dielectric filling region. In an embodiment, the device further includes an inter-layer dielectric overlapping and contacting the horizontal portion of the contact etch stop layer, wherein a top surface of the inter-layer dielectric is higher than a top surface of the gate spacer. In an embodiment, the work-function layer comprises opposing sidewall portions, and all of materials between the opposing sidewall portions and overlapping a bottom portion of the work-function layer comprises titanium nitride.

In accordance with some embodiments of the present disclosure, a method includes forming a dummy gate stack over a semiconductor region; forming gate spacers on opposite sides of the dummy gate stack; replacing the dummy gate stack with a replacement gate stack, wherein the replacement gate stack comprises: a gate dielectric layer; a work-function layer over the gate dielectric layer; and a high-resistance conductive layer over the work-function layer; etching back the replacement gate stack and the gate spacers; and depositing a metal layer on the work-function layer and the high-resistance conductive layer. In an embodiment, the etching back the replacement gate stack and the gate spacers comprises: performing a first etch-back process to recess the gate spacers and the replacement gate stack; and performing a second etch-back process to recess the work-function layer and the high-resistance conductive layer, wherein the gate spacers and the gate dielectric layer are un-etched in the second etch-back process. In an embodiment, the metal layer is lower than a top surface of the gate dielectric layer. In an embodiment, during the depositing the metal layer, the metal layer is selectively deposited on the work-function layer and the high-resistance conductive layer, and not on dielectric materials exposed when the depositing the metal layer is performed. In an embodiment, the gate dielectric layer comprises vertical portions forming a ring having four sides, and the metal layer is in contact with sidewalls of all of the four sides. In an embodiment, the depositing the metal layer comprises depositing a tungsten layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:

a first gate stack comprising:

a first high-k dielectric layer;

a first work-function layer overlapping a bottom portion of the first high-k dielectric layer;

a first blocking layer overlapping a bottom portion of the first work-function layer; and a first metal layer overlapping and contacting the first work-function layer and the first blocking layer, wherein the first blocking layer and the first metal layer form an interface, and the interface extends from a vertical center line of the first gate stack in opposing lateral directions; and a second gate stack comprising:

a second high-k dielectric layer;

a second work-function layer overlapping a bottom portion of the second high-k dielectric layer;

a second blocking layer overlapping a bottom portion of the second work-function layer, wherein the first blocking layer and the second blocking layer comprise a same metal compound;

a metal filling layer over the second blocking layer; and a second metal layer overlapping and contacting the second work-function layer and the second blocking layer, wherein the metal filling layer and the second metal layer comprise different materials.

2. The structure of claim 1 further comprising a dielectric filling region over and contacting the first metal layer and the first high-k dielectric layer.

3. The structure of claim 2 further comprising a gate spacer contacting a sidewall of the first high-k dielectric layer, wherein the dielectric filling region comprises a high portion overlapping the gate spacer.

4. The structure of claim 3 further comprising a contact etch stop layer contacting the gate spacer, wherein the contact etch stop layer comprises a part higher than a top edge of the gate spacer.

5. The structure of claim 1, wherein the first metal layer is lower than a top edge of the first high-k dielectric layer.

6. The structure of claim 1, wherein the second gate stack is wider than the first gate stack.

7. The structure of claim 1, wherein the first gate stack has a first total count of layers, and the second gate stack has a second total count of layers different from the first total count of layers.

8. The structure of claim 1, wherein in a cross-section of the structure, the metal filling layer has a rectangular cross-sectional shape.

9. The structure of claim 1, wherein the second metal layer comprises a top surface, wherein in a cross-sectional view of the structure, the top surface of the second metal layer continuously extends from a first sidewall of the second high-k dielectric layer to an opposing second sidewall of the second high-k dielectric layer.

10. A structure comprising:

a first gate stack comprising:

a first gate dielectric; and a first gate electrode comprising:

a first work-function layer over the first gate dielectric;

a first blocking layer comprising titanium nitride over and contacting the first work-function layer;

a first metal layer over and contacting the first work-function layer and the first blocking layer, wherein an entire top surface of the first blocking layer is in contact with the first metal layer; and a second gate stack wider than the first gate stack, the second gate stack comprising:

a second gate dielectric; and a second gate electrode comprising:

a second work-function layer over the second gate dielectric;

a second blocking layer comprising titanium nitride over and contacting the second work-function layer;

a filling-metal region over the first blocking layer; and a second metal layer, wherein top surfaces of the second blocking layer are in physical contact with both of a first bottom surface of the filling-metal region and a second bottom surface of the second metal layer, wherein the filling-metal region and the second metal layer form a distinguishable interface in between.

11. The structure of claim 10, wherein the first gate electrode comprises fewer layers than the second gate electrode.

12. The structure of claim 10, wherein the first metal layer and the second metal layer comprise a same metal as the filling-metal region.

13. The structure of claim 10, wherein the first metal layer is lower than a top end of the first gate dielectric.

14. The structure of claim 10 further comprising a gate spacer contacting the first gate stack, wherein the first metal layer is lower than a top end of the gate spacer.

15. The structure of claim 14 further comprising:
a source/drain region on a side of the first gate dielectric; and
a contact etch stop layer comprising a first portion over and contacting the source/drain region, and a second portion contacting the gate spacer.

16. The structure of claim 10, wherein the second metal layer comprises a top surface, wherein in a cross-sectional view of the structure, the top surface of the second metal layer continuously extends from a first sidewall of the second gate dielectric to an opposing second sidewall of the second gate dielectric.

17. A structure comprising:
a gate spacer;
a gate stack comprising:
a gate dielectric;
a plurality of conductive layers on the gate dielectric, wherein the plurality of conductive layers comprise a lower layer and a topmost layer over the lower layer, and the topmost layer has a lower resistivity than the lower layer;
a metal layer over and contacting top surfaces of the plurality of conductive layers, wherein a first sidewall of the metal layer contacts a second sidewall of the gate dielectric, and wherein the metal layer and the topmost layer comprise different materials;
a dielectric filling region comprising:
a first portion over and contacting the gate spacer, wherein a part of the first portion is lower than a first top end of the gate spacer; and
a second portion over and contacting the metal layer; and
a source/drain region aside the gate spacer.

18. The structure of claim 17 further comprising a contact etch stop layer comprising:
a first part overlapping the source/drain region; and
a second part contacting the gate spacer, wherein the second part comprises a second top end higher than the first top end of the gate spacer.

19. The structure of claim 17, wherein the metal layer and the topmost layer comprise a same metal.

20. The structure of claim 17, wherein the metal layer comprises a top surface, wherein in a cross-sectional view of the structure, the top surface of the metal layer continuously extends from a first sidewall of the gate dielectric to an opposing second sidewall of the gate dielectric.

* * * * *